US012626773B2

(12) United States Patent
      Kwak

(10) Patent No.: US 12,626,773 B2
(45) Date of Patent: May 12, 2026

(54) MEMORY DEVICE AND MEMORY SYSTEM INCLUDING PLURAL SWITCH TRANSISTORS IN A STRING

(71) Applicant: SK hynix Inc., Gyeonggi-do (KR)

(72) Inventor: Dong Hun Kwak, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 213 days.

(21) Appl. No.: 18/501,029

(22) Filed: Nov. 3, 2023

(65) Prior Publication Data

US 2025/0006280 A1    Jan. 2, 2025

(30) Foreign Application Priority Data

Jun. 30, 2023    (KR) ........................ 10-2023-0085219

(51) Int. Cl.
   *G11C 16/34*    (2006.01)
   *G11C 16/04*    (2006.01)
   *G11C 16/10*    (2006.01)
   *G11C 16/14*    (2006.01)

(52) U.S. Cl.
   CPC ...... *G11C 16/3459* (2013.01); *G11C 16/0433* (2013.01); *G11C 16/0483* (2013.01); *G11C 16/102* (2013.01); *G11C 16/14* (2013.01)

(58) Field of Classification Search
   CPC ............ G11C 16/3459; G11C 16/0433; G11C 16/0483; G11C 16/102; G11C 16/14; G11C 11/5628; G11C 16/10; G11C 11/407; G06F 3/0658; G06F 3/0659
   See application file for complete search history.

(56) References Cited

U.S. PATENT DOCUMENTS

| | | | |
|---|---|---|---|
| 2019/0122734 A1* | 4/2019 | Shibata | ................... G11C 16/26 |
| 2022/0130474 A1 | 4/2022 | Choi et al. | |
| 2023/0178165 A1* | 6/2023 | Lee | ................... G11C 29/12005 |
| 2024/0355392 A1* | 10/2024 | Rajagiri | ............. G11C 16/0483 |
| 2024/0363177 A1* | 10/2024 | Prakash | ................. G11C 16/10 |

FOREIGN PATENT DOCUMENTS

KR        10-2026177 B1    9/2019

* cited by examiner

*Primary Examiner* — Donald HB Braswell
(74) *Attorney, Agent, or Firm* — IP & T GROUP LLP

(57) ABSTRACT

A memory device includes a cell array and control circuitry. The cell array includes plural memory cells and plural switch transistors. The control circuitry is configured to perform checking and recovery operations regarding operating states of the plural switch transistors during operation margins set for the plural data input/output operations.

19 Claims, 12 Drawing Sheets

| OP. TYPE | String0 | | | String1 | | | String2 | | | String3 | | |
|---|---|---|---|---|---|---|---|---|---|---|---|---|
| Switch Cell | DSL | Center | SSL | DSL | Center | SSL | DSL | Center | SSL | DSL | Center | SSL |
| CHECK | E | P | E | E | P | E | E | P | E | E | P | E |
| RECOVERY | E | P | E | E | P | E | E | P | E | E | P | E |

| Switch Cell TYPE | DSL | Center | SSL |
|---|---|---|---|
| Case1 | E | P | E |
| Case2 | E | E | P |
| Case3 | P | E | E |

182

MEMORY DEVICE AND MEMORY SYSTEM INCLUDING PLURAL SWITCH TRANSISTORS IN A STRING

CROSS-REFERENCE TO RELATED APPLICATIONS

This patent application claims the benefit of priority under 35 U.S.C. § 119(a) to Korean Patent Application No. 10-2023-0085219, filed on Jun. 30, 2023, the entire disclosure of which is incorporated herein by reference.

TECHNICAL FIELD

One or more embodiments of the present disclosure described herein relate to a memory device, and more particularly, to plural switch transistors coupled to plural memory cells included in the memory device.

BACKGROUND

A data processing system including a memory system or a data storage device can store more amounts of data in the data storage device and store data in the data storage device more quickly. The memory system has been developed to output data stored in the data storage device more quickly. The data storage device may include non-volatile memory cells and/or volatile memory cells for storing data.

BRIEF DESCRIPTION OF THE DRAWINGS

The description herein makes reference to the accompanying drawings wherein like reference numerals refer to like parts throughout the figures.

DETAILED DESCRIPTION

Figure 1:
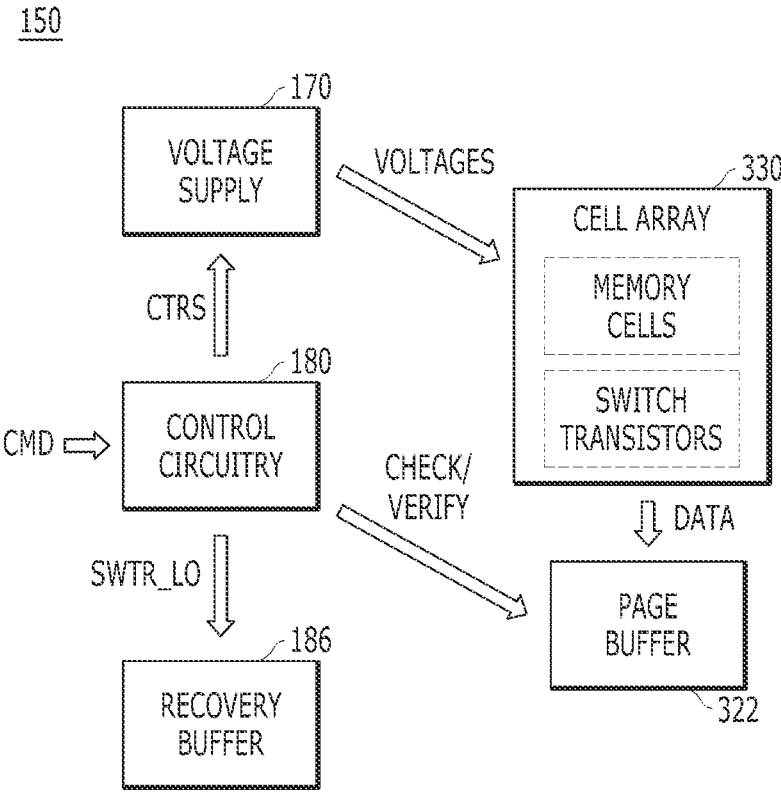
FIG. 1 illustrates a memory device according to an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components e.g., an interface unit, circuitry, etc.

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational, e.g., is not turned on nor activated. Examples of block/unit/circuit/component used with the "configured to" language include hardware, circuits, memory storing program instructions executable to implement the operation, etc. Additionally, "configured to" can include a generic structure, e.g., generic circuitry, that is manipulated by software and/or firmware, e.g., an FPGA or a general-purpose processor executing software to operate in a manner that is capable of performing the task(s) at issue. "Configured to" may also include adapting a manufacturing process, e.g., a semiconductor fabrication facility, to fabricate devices, e.g., integrated circuits that are adapted to implement or perform one or more tasks.

As used in this disclosure, the term 'machine,' 'circuitry' or 'logic' refers to all of the following: (a) hardware-only circuit implementations such as implementations in only analog and/or digital circuitry and (b) combinations of circuits and software and/or firmware, such as (as applicable): (i) to a combination of processor(s) or (ii) to portions of processor(s)/software including digital signal processor(s), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'machine,' 'circuitry' or 'logic' applies to all uses of this term in this application, including in any claims. As a further example, as used in this application, the term 'machine,'

'circuitry' or 'logic' also covers an implementation of merely a processor or multiple processors or a portion of a processor and its (or their) accompanying software and/or firmware. The term 'machine,' 'circuitry' or 'logic' also covers, for example, and if applicable to a particular claim element, an integrated circuit for a storage device.

As used herein, the terms 'first,' 'second,' 'third,' and so on are used as labels for nouns that they precede, and do not imply any type of ordering, e.g., spatial, temporal, logical, etc. The terms 'first' and 'second' do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term 'based on' is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

Embodiments of the present invention may provide a memory device and a memory system including the memory device that can improve data input/output performance by performing check and recovery operations regarding operating state deterioration of plural switch transistors without affecting data input/output operations.

In addition, an embodiment of the present invention can reduce errors in the data input/output operations performed in the memory device through the checking and recovery operations regarding operating state deterioration of the plural switch transistors, thereby improving operational reliability of the memory device and the memory system including the memory device.

An embodiment of the present invention can provide a memory device, including a cell array comprising plural memory cells and plural switch transistors and control circuitry configured to perform checking and recovery operations regarding operating states of the plural switch transistors during operation margins set for the plural data input/output operations.

The plural switch transistors can include at least one drain select transistor configured to control connections between the plural memory cells and a bit line; at least one source select transistor configured to control connections between the plural memory cells and a common source line; and at least one central switching transistor disposed between the plural memory cells.

The at least one central switching transistor can be disposed between two vertically stacked portions, each comprising at least some of the plural memory cells.

The plural data input/output operations can include one or more erase operation for erasing data remaining in the plural memory cells and one or more program operation for programming data in the plural memory cells.

The control circuitry can be configured to perform the checking operation during an operation margin of the one or more erase operations, while the recovery operation can be performed during an operation margin of the one or more program operations.

The control circuitry can be configured to perform the checking and recovery operations during operation margins of plural program operations.

The control circuitry can be configured to divide the checking and recovery operations into plural unit operations based on locations of the plural switch transistors.

The control circuitry can be configured to perform the unit operations for each of the plural switch transistors during the operation margin set for each of the plural data input/output operations.

The control circuitry can be configured to perform the unit operations on a single switch transistor during the operation margins set for the plural data input/output operations.

The memory device can further include a buffer configured to store location information of deteriorated switch transistors among the plural switch transistors.

The control circuitry can be configured to generate a switch transistor recovery command comprising the location information, based on which one of the plural data input/output operations is performed in the cell array.

The control circuitry can be configured to generate a control signal for the checking operation when an erase command is input.

The control circuitry can be configured to generate a control signal for the recovery operation when a program command is input. In another embodiment, a memory system can include a memory device comprising plural memory cells and plural switch transistors; and a controller configured to generate a program command for a program operation on the plural memory cells based on whether to perform checking and recovery operations regarding operating states of the plural switch transistors.

The program command can be one of: a first program command for performing the program operation along with the checking and recovery operations; and a second program command for performing the program operation only without the checking and recovery operations.

The controller can be configured to generate the first program command based on program data which is to be programmed as a part of multi-bit data in the plural memory cells of the cell array during the program operation.

The controller can be configured to: generate an erase command for erasing data remaining in the plural memory cells and the checking operation for checking the operating states of the plural switch transistors; and generate the program operation and the recovery operation for recovering an operating state of a deteriorated switch transistor among the plural switch transistors.

The plural switch transistors can include at least one drain select transistor configured to control connection between the plural memory cells and a bit line; at least one source select transistor configured to control connections between the plural memory cells and a common source line; and at least one central switching transistor disposed between the plural memory cells.

In another embodiment, a memory system can include a memory device comprising plural memory cells and plural switch transistors; and a controller configured to transmit plural data input/output commands to the memory device, the plural data input/output commands designed for the memory device to perform checking and recovery operations for checking and recovering to operating states of the plural switch transistors during plural data input/output operations performed based on the plural data input/output commands.

The plural data input/output commands can include a program command for the memory device to perform a program operation for programming data therein along with the checking and recovery operations.

Embodiments will now be described with reference to the accompanying drawings, wherein like numbers reference like elements.

FIG. 1 illustrates a memory device according to an embodiment of the present disclosure.

Referring to FIG. 1, the memory device 150 may include a cell array 330. The cell array 330 may have a two-dimensional or three-dimensional structure. The cell array 330 may include a plurality of memory cells capable of storing data and a plurality of switch transistors configured to control connections between the plurality of memory cells and a bit line, a source line, etc. The structure of the cell array 330 will be described later with reference to FIGS. 2 and 3.

The memory device 150 may include control circuitry 180. The control circuitry 180 may receive a command CMD input from an outside of the memory device. The command CMD may be transmitted from the controller 130 (see FIGS. 9 and 10) or the host 102 (see FIG. 9). For example, the command CMD may be for outputting data stored in the cell array 330, storing data in the cell array 330, or erasing data stored or remained in the cell array 330. According to an embodiment, the command CMD may be used to check an operating state of the memory device 150 or to perform an operation to improve input/output performance, lifespan, wear, etc. of the memory device 150.

The control circuitry 180 that receives the command CMD may transmit a control signal CTRS to a voltage supply circuit 170. The voltage supply circuit 170 may generate at least one voltage in response to the control signal CTRS and transmit the at least one voltage to the cell array 330. For example, in response to the control signal CTRS, the voltage supply circuit 170 may supply a read voltage to a memory cell in which read data is stored and a pass voltage to another memory cell coupled to the corresponding memory cell. The voltage supply circuit 170 may transmit various voltages capable of determining turn-on or turn-off of the plurality of switch transistors to the cell array 330 in response to the control signal CTRS.

During a read operation, the cell array 330 may output data stored in a memory cell to a page buffer 322 in response to at least one voltage applied by the voltage supply circuit 170. Additionally, during a program operation, data stored in the page buffer 322 may be stored in the memory cell within the cell array 330. When the control circuitry 180 tries to erase data stored in a plurality of memory cells, the data stored in the plurality of memory cells included in a preset unit or group (e.g., a memory block) in the cell array 330 may be erased together. In addition to data input/output operations for the memory cell in the cell array 330, the control circuitry 180 may check an operating state of the plurality of switch transistors in the cell array 330 and perform a recovery operation for at least one deteriorated switch transistor. In this case, the cell array 330 may output an operating status of the switch transistor, like data, to the page buffer 322 in response to the plurality of voltages applied by the voltage supply circuit 170. Here, the operating state of the switch transistor may indicate the threshold voltage of the switch transistor. The operating state of the switch transistor will be described later with reference to FIG. 4.

The control circuitry 180 can check the operating state of the switch transistor in the cell array 330 through a process CHECK/VERIFY of checking a value stored in the page buffer 322. According to an embodiment, if it is determined that the operating state of the switch transistor in the cell array 330 is different from a preset state, location information SWTR_LO of the corresponding switch transistor may be stored in a recovery buffer 186.

If the operations of checking and recovering the operating state of the switch transistor in the cell array 330 are continuously performed, the control circuitry 180 may not need to store the location information of the switch transistor to be recovered. However, if the operations of checking and recovering the operating state of the switch transistor in the cell array 330 could not be performed continuously, the control circuitry 180 may store the location information regarding a deteriorated switch transistor, which may cause an error during a data input/output operation, recognized through the process of checking the operating state of the switch transistor. After saving the location of the switch transistor, an operation of recovering the operating state of the switch transistor corresponding to the saved location can be performed via subsequent operations. The operations of checking and recovering the operating state of the switch transistor in the cell array 330 will be described later with reference to FIGS. 6, 8, 11, and 12.

Figure 2:
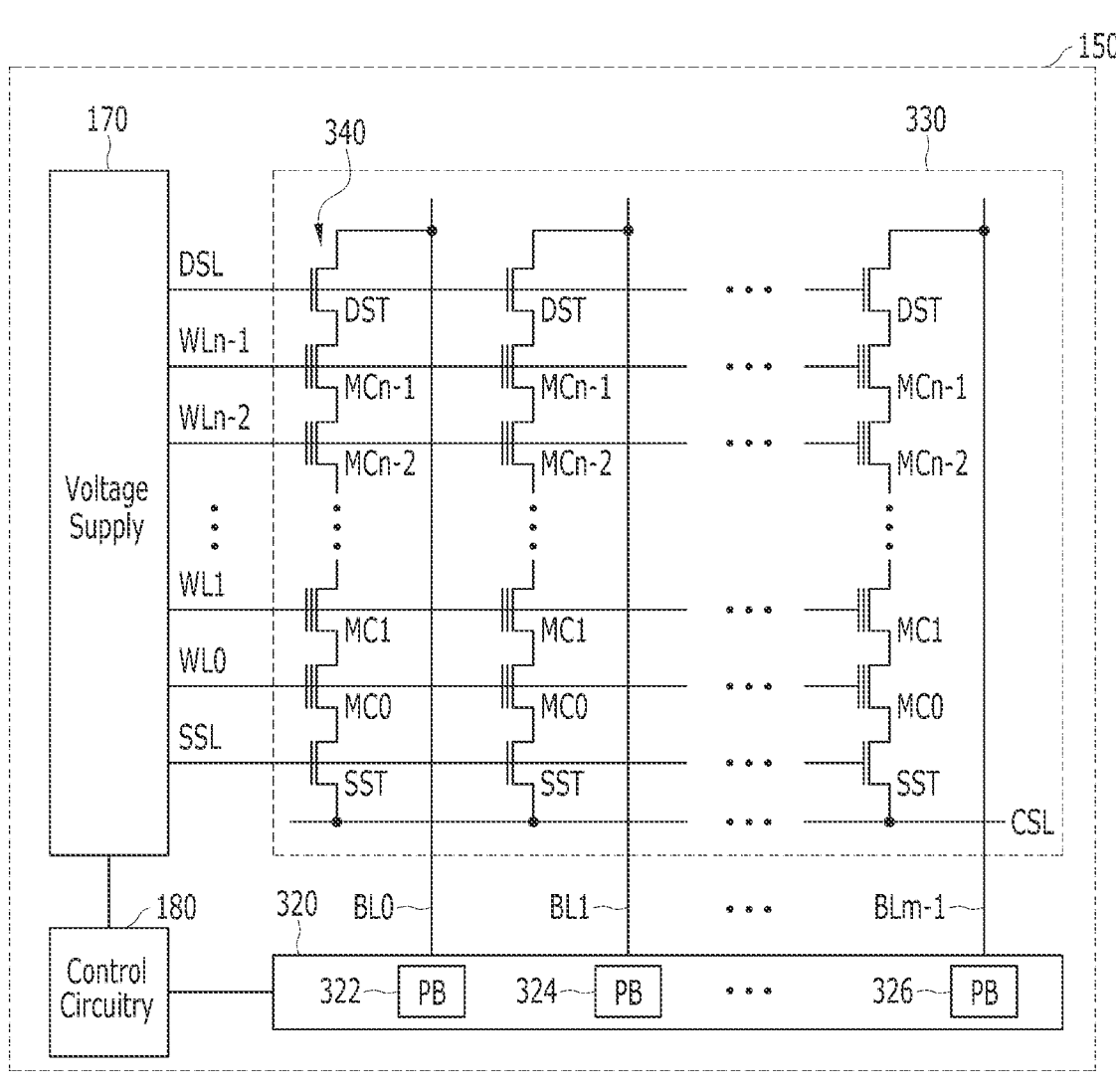
FIG. 2 illustrates a memory device according to another embodiment of the present disclosure.

FIG. 2 illustrates a memory device according to another embodiment of the present disclosure. Specifically, FIG. 2 illustrates a memory cell group (e.g., a cell array) included in a memory plane or a memory die included in the memory device 150 according to an embodiment of the present disclosure.

Referring to FIG. 2, the memory device 150 may include at least one memory group 330 having a plurality of cell strings 340. Each cell string 340 may include a plurality of non-volatile memory cells MC0 to MCn−1 connected to a respective bit line of a plurality of bit lines BL0 to BLm−1. The cell strings 340 are disposed in respective columns of the memory group 330, and each cell string 340 can include at least one drain select transistor DST and at least one source select transistor SST. The non-volatile memory cells MC0 to MCn−1 of each cell string 340 may be connected in series between a drain select transistor DST and a source select transistor SST. Each of the non-volatile memory cells MC0 to MCn−1 may be configured as a multi-level cell (MLC) that stores a data item having plural bits per cell. The cell strings 340 may be electrically connected to corresponding bit lines of the bit lines BL0 to BLm−1.

In an embodiment, the memory group 330 may include NAND-type flash memory cells MC0 to MCn−1. In another embodiment, the memory group 330 can be implemented as a NOR-type flash memory, a hybrid flash memory in which at least two different types of memory cells are mixed or combined, or a one-chip NAND flash memory in which a controller is embedded in a single memory chip. In an embodiment, the memory group 330 can include a flash memory cell including a charge trap flash (CTF) layer that includes a conductive floating gate or insulating layer.

According to an embodiment, the memory device 150 shown in FIG. 2 can include at least one memory block. The memory group 330 can have a two-dimensional (2D) or three-dimensional (3D) structure. For example, each of the memory blocks in the memory device 150 may be implemented as a 3D structure, for example, a vertical structure. Each of the memory blocks may have a three-dimensional structure extending along first to third directions, for example, an x-axis direction, a y-axis direction, and a z-axis direction.

The memory group 330 including at least one memory block can be coupled to a plurality of bit lines BL, a plurality of string select lines SSL, a plurality of drain select lines DSL, a plurality of word lines WL, a plurality of dummy word lines DWL, and a plurality of common source lines CSL. In one embodiment, the memory group 330 can include a plurality of NAND strings NS which, for example, may respectively correspond to cell strings 340. Each NAND string NS may include a plurality of memory cells MC and may be connected to a respective bit line of the bit lines BL. In addition, the string select transistor SST of each NAND string NS may be connected to a common source line CSL, and the drain select transistor DST of each NAND string NS can be connected to a corresponding bit line BL. In each NAND string NS, the memory cells MC may be arranged between the string select transistor SST and the drain select transistor DST.

The memory device 150 may include the voltage supply circuit 170 which can supply a word line voltage e.g., one or more predetermined voltages such as a program voltage, a read voltage, and a pass voltage, for respective word lines of the word lines according to an operation mode, or may supply a voltage to a bulk, e.g., a well region, in which each memory block including the memory cells MC are formed. In this case, a voltage generating operation of the voltage supply circuit 170 may be performed under control of the control circuitry 180. Also, the voltage supply circuit 170 may generate a plurality of variable read voltages to distinguish a plurality of data items from each other.

In response to the control of the control circuitry 180, one of the memory blocks (or sectors) of the memory cell array may be selected, and one of the word lines of the selected memory block may be selected. Word line voltages may be supplied to the selected word line and the unselected word line of the memory group 330, individually. The voltage supply circuit 170 may include a voltage generation circuit for generating target voltages having various levels, which are applicable to word lines of the memory group 330.

The memory device 150 may also include a read/write circuit 320 controlled by the control circuitry 180. The read/write circuit 320 may operate as a sense amplifier or a write driver according to an operation mode. For example, in a verify operation and a read operation, the read/write circuit 320 may operate as a sense amplifier for reading the data item from the memory cell array. In a program operation, the read/write circuit 320 may operate as a write driver that controls potentials of bit lines according to a data item to be stored in the memory cell array. The read/write circuit 320 may receive the data item to be programmed to the cell array from page buffers during the program operation. The read/write circuit 320 can drive bit lines based on the input data item. To this end, the read/write circuit 320 may include a plurality of page buffers (PB) 322, 324, 326, with each page buffer corresponding to each column or each bit line, or each column pair or each bit line pair. According to an embodiment, a plurality of latches may be included in each of the page buffers 322, 324, 326. According to an embodiment, the number of latches or page buffers coupled to each bit line can be equal to, or greater than, the number of bits of data stored in the memory cells MC.

The page buffers 322, 324, 326 may be coupled to a data input/output device, e.g., a serialization circuit or a serializer, through a plurality of buses BUS. When each of the page buffers 322, 324, 326 is coupled to the data input/output device through different buses, a delay that may occur in data transmission from the page buffers 322, 324, 326 can be reduced. For example, each page buffer 322, 324, 326 can perform the data transmission without a waiting time.

According to an embodiment, the memory device 150 may receive a write command, write data, and information, e.g., a physical address, regarding a location in which the write data is to be stored. The control circuitry 180 causes the voltage supply circuit 170 to generate a program pulse, a pass voltage, etc., used for a program operation performed in response to a write command, and to generate one or more voltages used for a verification operation performed after the program operation.

When a multi-bit data item is programmed in non-volatile memory cells included in the memory group 330, the error rate might be higher than that when a single-bit data item is stored in the non-volatile memory cells. For example, an error in the non-volatile memory cells may be induced due to cell-to-cell interference (CCI). In order to reduce error in the non-volatile memory cells, a width (deviation) of a threshold voltage distribution, corresponding to stored data items between the non-volatile memory cells, should be reduced.

To this end, the memory device 150 can perform an incremental step pulse programming (ISPP) operation to effectively make a narrow threshold voltage distribution of the non-volatile memory cells. In an embodiment, the memory device 150 can use the ISPP operation for multi-step program operations. For example, the memory device 150 may divide a program operation into a Least Significant Bit (LSB) program operation and a Most Significant Bit (MSB) operation according to a predetermined order between the non-volatile memory cells or pages.

A multi-bit value programmed in a memory cell in a NAND flash memory (e.g., NAND-type flash memory cells MC0 to MCn−1 in the memory group 330) can be determined based on a threshold voltage window or a threshold voltage distribution to which the cell's threshold voltage belongs. As a size of each memory cell shrinks and more bits (e.g., 3-bit, 4-bit, or 5-bit) of data are programmed per memory cell, a width of the threshold voltage window used to represent each multi-bit value becomes narrower, increasing an error rate when determining the multi-bit value stored in the memory cell. This is because process variations become more widespread when an amount of charge stored in each memory cell decreases with a feature size, resulting in large differences in threshold voltages of different memory cells storing the same value. As a result, it becomes increasingly difficult to determine which value a threshold voltage of a memory cell corresponds to.

According to an embodiment, the control circuitry 180 may include a read retry table (RRT). The RRT may be stored in the memory device 150. A read error may occur in a process of applying a read voltage to a non-volatile memory cell in the memory device 150 through a word line and reading data stored in the non-volatile memory cell. The control circuitry 180 in the memory device 150 may manage information regarding a read retry mechanism for resolving read errors. One of the information regarding the read retry mechanism is the read RRT. The read retry mechanism uses the RRT for a recorded location where the error has occurred, so that the memory device 150 can ensure data integrity by applying an appropriate correction value (e.g., changing a read voltage level) when re-reading.

Figure 3:
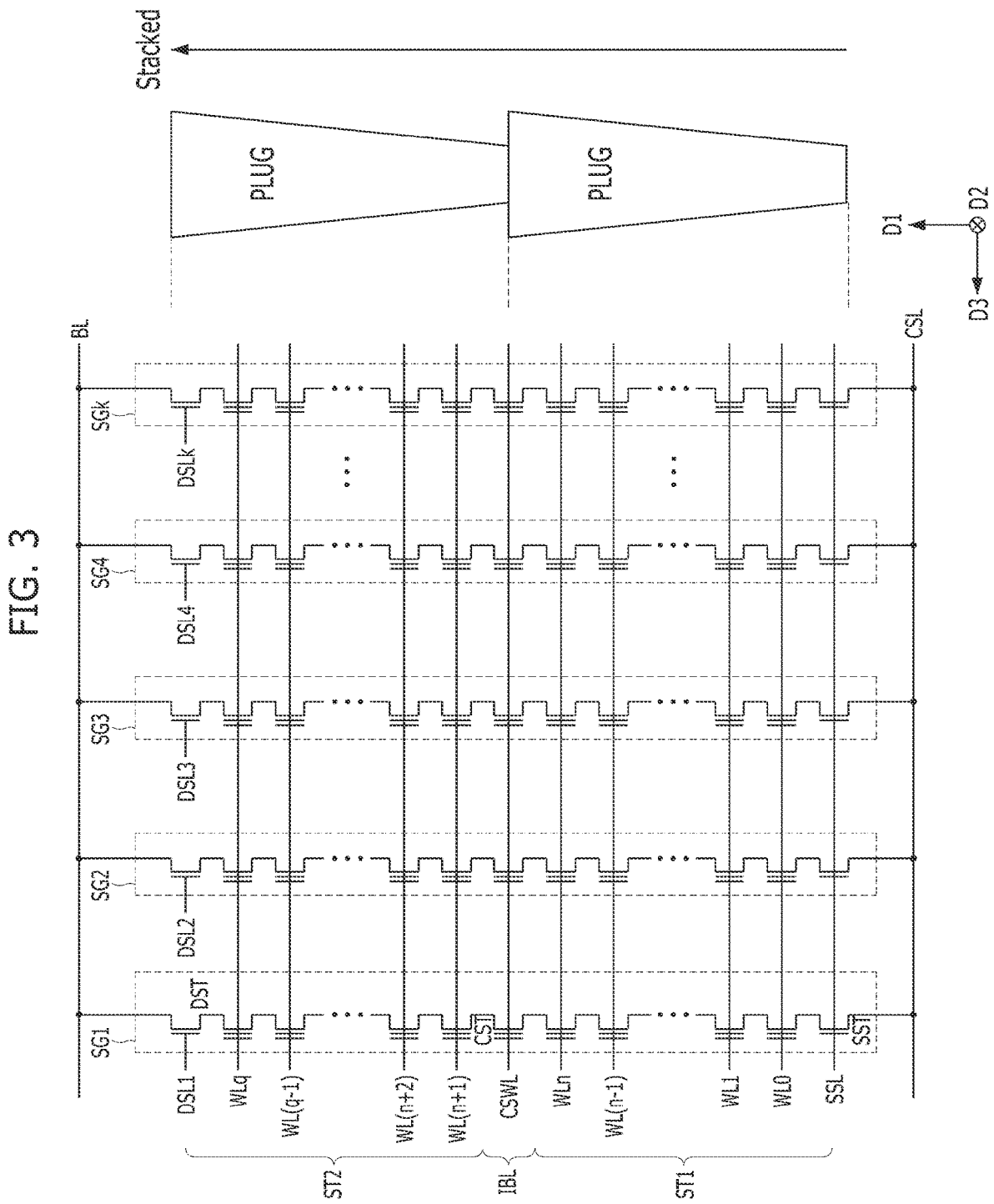
FIG. 3 illustrates a memory cell array according to another embodiment of the present disclosure.

FIG. 3 illustrates a memory cell array according to another embodiment of the present disclosure.

Referring to FIG. 3, the memory cell array may have a structure including portions or layers stacked in a vertical direction D1. The memory cell array may include at least one memory block. Hereinafter, a direction substantially perpendicular to the upper surface of the substrate may be defined as a first direction D1, and two directions parallel to the upper surface of the substrate and intersecting each other may be defined as the second direction D2 and the third direction D3, individually. For example, the second direction D2 and the third direction D3 may intersect each other substantially perpendicularly. The first direction D1 may be referred to as a vertical direction, the second direction D2 may be referred to as a row direction, and the third direction D3 may be referred to as a column direction. The direction indicated by the arrow in the drawing and the direction opposite to it are described as the same direction.

For convenience of description, FIG. 3 shows NAND strings or cell strings SG1 to SGk connected to one bit line BL and one common source line CSL among the cell strings included in the memory block.

The memory block may include a plurality of cell strings SG1 to SG5 connected between the same bit line (BL) and the common source line CSL. Each of the cell strings SG1 to SGk can include at least one source select transistor SST controlled by a source select line SSL, plural memory cells controlled by word lines WL, a central switching transistor CST disposed in an intermediate boundary layer IBL and controlled by a central switching word line CSWL, and a drain select transistor DST controlled by each drain select line DSL1, DSL2, DSL3, . . . , DSLk.

According to an embodiment, plural memory cells connected to at least one word line located at both ends of first and second stacks ST1, ST2 in the first direction D1 may be dummy cells. Any data may not be stored in the dummy cells. Further, according to an embodiment, the dummy cells may be used to store data having a smaller number of bits than other memory cells. According to an embodiment, the intermediate boundary layer IBL may include at least one gate line. One gate line corresponds to the central switching word line CSWL which can simultaneously control switching operations of the central switching transistors CST connected thereto. Further, although FIG. 3 illustrates a structure in which the first and second stacks ST1, ST2 are stacked, three or more stacks may be vertically stacked in the cell array 330. When a plurality of stacks are stacked, an intermediate boundary layer IBL may be formed and disposed between each two stacked stacks. The intermediate boundary layer IBL may include at least one switching transistor configured to couple memory cells in one stack of the two stacks to other memory cells in the other stack.

FIG. 3 shows an embodiment in which the source select transistors SST included in the plurality of cell strings SG1 to SGk are connected to the common selection line CSL. However, according to an embodiment, a certain number of source selection transistors could be coupled to each of plural source ground selection lines.

Referring to FIGS. 1 to 3, the cell array 330 can include a plurality of memory blocks arranged along a plurality of directions D1, D2, D3. In an embodiment, a memory block may be selected by the control circuitry 180 shown in FIGS. 1 and 2. For example, a read voltage, a program voltage, or an erase voltage may be applied to a memory block and a word line selected by the control circuitry 180.

Each of the cell strings SG1 to SGk may include a plurality of switch transistors as well as a plurality of memory cells capable of storing data. Here, the plurality of switch transistors can include a drain select transistor DST, a source select transistor SST, and a central switching transistor CST. FIG. 3 shows an embodiment in which each of the cell strings SG1 to SGk includes one drain select transistor DST, one source select transistor SST, and one central switching transistor CST, respectively. However, according to an embodiment, each of the cell strings SG1 to SGk may include a plurality of drain select transistors DST, a plurality of source select transistors SST, or a plurality of intermediate switching transistors CST.

Figure 4:
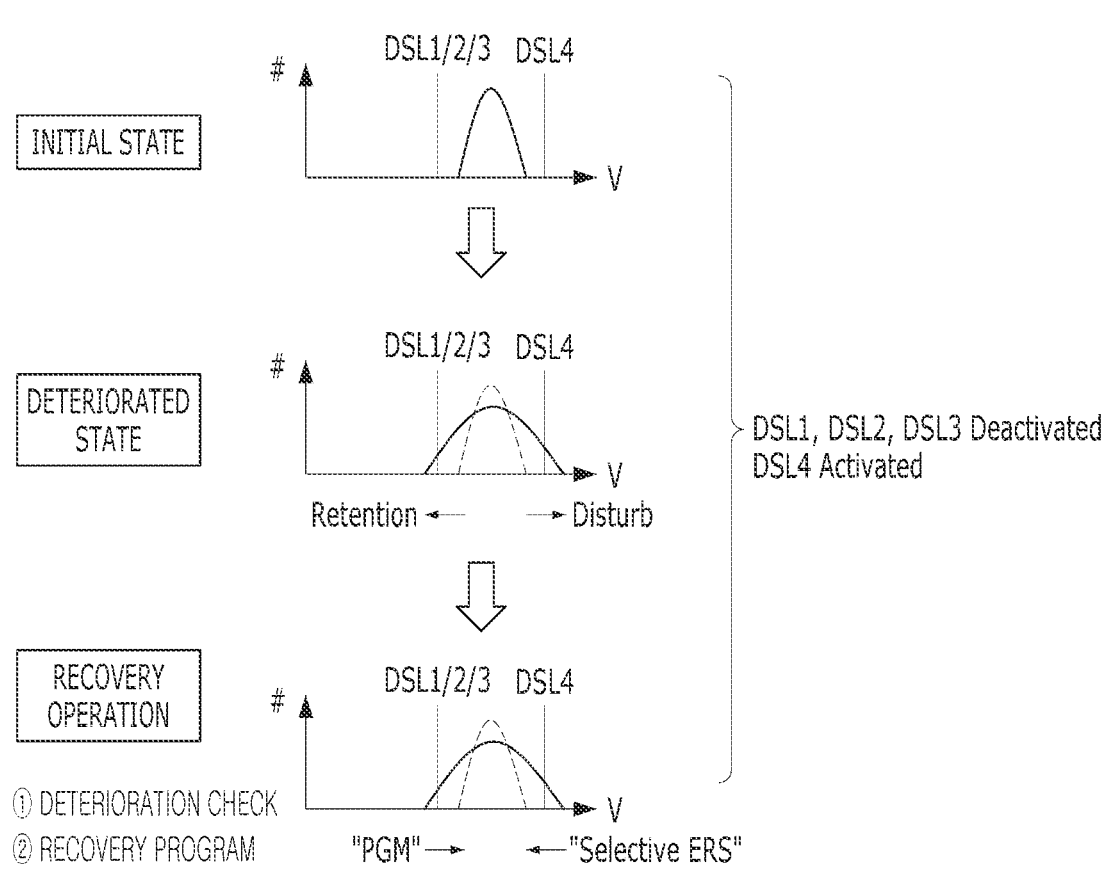
FIG. 4 illustrates check and recovery operations regarding operating states of switch transistors according to another embodiment of the present disclosure.

FIG. 4 illustrates check and recovery operations regarding operating states of switch transistors according to another embodiment of the present disclosure. The drain select transistor DST described in FIG. 3 is one of switch transistors. FIG. 4 illustrates the change in threshold voltage of the drain select transistor DST as an example showing operations of checking and recovering an operating state of a switch transistor.

Referring to FIGS. 1 to 4, the NAND strings 340 or the cell strings SG1 to SGk included in the cell array 330 of the memory device 150 can include the drain select transistor DST that operates as a switch transistor. Here, the switch transistor can include an element used for operating the NAND strings 340 or the cell strings SG1 to SGk rather than for storing data.

In an initial state, the threshold voltage distribution of the drain select transistor DST included in the NAND strings 340 or the cell strings SG1 to SGk can be located between two voltage levels applied to the drain select lines DSL1, DSL2, DSL3, . . . , DSLk. For example, among the four drain selection lines DSL1, DSL2, DSL3, DSL4 shown in FIG. 4, a first voltage level may be applied to deactivate the first to third drain selection lines DSL1, DSL2, DSL3. However, a second voltage level may be applied to activate the fourth third drain selection line DSL4. The threshold voltage distribution of the plurality of drain select transistors DST included in the NAND strings 340 or the cell strings SG1 to SGK may be preset to be located between the first voltage level and the second voltage level.

As time goes by and data is input/output to/from the memory device 150, deterioration may occur in both the plural memory cells and the plural switch transistors included in the NAND strings 340 or the cell strings SG1 to SGk. As a program-erase cycle (P/E Cycle) of the memory block in the memory device 150 increases, a temperature in the memory device 150 increases, or a high voltage is applied or used in the memory device 150, the threshold voltage distribution of the switch transistors as well as the memory cells included in the NAND strings 340 or the cell strings SG1 to SGk might not be maintained constant. For example, if the switch transistors are left unattended for a long time (Retention), the threshold voltage distribution of the switch transistors may become lowered. Further, when a high-level voltage is repeatedly applied to the switch transistors, disturb may occur so that the threshold voltage distribution of the switch transistors may increase.

As time passes and a deteriorated state emerges, the threshold voltage distribution of the plurality of drain select transistors DST included in the NAND strings 340 or the cell strings SG1 to SGk might not be between the first voltage level and the second voltage level. For example, the threshold voltage distribution of the plurality of drain select transistors DST may be shifted to be lower than the first voltage level or higher than the second voltage level. When the threshold voltage distribution of the plurality of drain select transistors DST included in the NAND strings 340 or the cell strings SG1 to SGk deviates from a range between the first voltage level and the second voltage level, at least some drain selection transistors DST might not work as a switch based on the first voltage level and the second voltage level applied through the drain selection lines DSL1, DSL2, DSL3, . . . , DSLk to the drain selection transistors DST. Accordingly, the memory device 150 can check the threshold voltage distribution of the switch transistor and recover the threshold voltage distribution of the switch transistor to its initial state.

When a deteriorated switch transistor is found in the operation of checking the threshold voltage distribution of the switch transistors, the memory device 150 may perform a recovery operation to shift a threshold voltage of the deteriorated switch transistor to the range between the first voltage level and the second voltage level. For example, if a threshold voltage of the deteriorated switch transistor has a lower level than the first voltage level, a program operation for the deteriorated switch transistor may be performed to increase the threshold voltage of the deteriorated switch transistor up to the range between the first voltage level and the second voltage level. Conversely, when the threshold voltage of the deteriorated switch transistor has a higher level than the second voltage level, a selective erase operation can be performed to lower the threshold voltage of the corresponding switch transistor. Through this recovery operation, the threshold voltage distribution of the plurality of drain select transistors DST included in the NAND strings 340 or the cell strings SG1 to SGK could be located between the first voltage and the second voltage, so that the plurality of drain select transistors DST may have no issues working as a switch in response to the first and second voltage levels.

Figure 5:
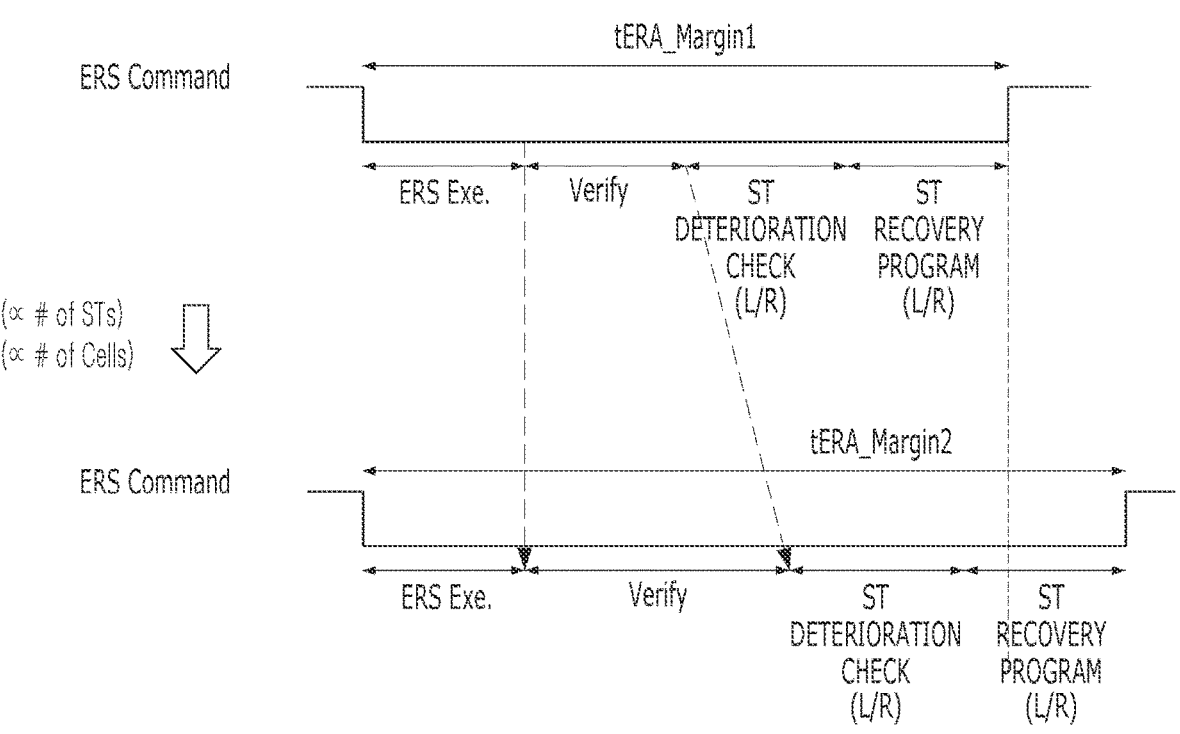
FIG. 5 illustrates the check and recovery operations regarding the operating states of switch transistors during an erase operation according to an embodiment of the present disclosure.

FIG. 5 illustrates the check and recovery operations regarding the operating states of switch transistors during an erase operation according to an embodiment of the present disclosure.

Referring to FIG. 5, the check and recovery operation regarding the operating states of the switch transistors may be performed during an erase operation for a specific memory block. The erase operation may be performed in response to an erase command (ERS Command). Among a read operation, a program operation, and an erase operation, the longest operation margin can be set for the erase operation. According to an embodiment, the erase operation may have the longest operation margin among the data input/output operations. Further, the program operation may have a longer operation margin than the read operation. The operation margin for each of the read operations, the program operations, and the erase operations may be determined based on either international standards or specifications related to the memory device 150 or I/O performance or throughput of the memory device 150.

Provided that the check and recovery operation regarding the operating states of the switch transistors affects data input/output operations such as storing data in a memory cell, reading data stored in a memory cell, or erasing data stored in a memory cell, operating performance of the memory device 150 may decrease. To avoid or prevent a decrease in the operating performance of the memory device 150, it is possible to additionally perform the check and recovery operation regarding the operating states of the switch transistors during an operation margin for the erase operation because the erase operation could secure the longest operation margin.

Referring to FIG. 5, a first operation margin tERA_Margin1 of the erase operation corresponding to the erase command (ERS Command) may be preset. During the first operation margin tERA_Margin1 of the erase operation, an operation to erase data stored or remaining in a specific memory block can be performed and it could be verified whether all data in the corresponding memory block has been completely erased by the erase operation. Thus, the first operation margin tERA_Margin1 of the erase operation may include a first section (ERS Exe.) to which the erase voltage is applied to the corresponding memory block and a second section (Verify) to which the verification voltage is applied to the corresponding memory block.

After the erase operation is completed (that is, after applying the erase voltage and then applying the verification voltage to check that all data has been erased in the specific memory block), the first operation margin tERA_Margin1 of the erase operation may be left because the first operation margin tERA_Margin1 could be sufficiently set. For example, because it might be possible to perform the erase operation multiple times based on an operating state of the memory block, the first operation margin tERA_Margin1 of the erase operation could be set generously.

The memory device 150 can check whether the switch transistor included in the corresponding memory block is deteriorated during a remaining time of the first operation margin tERA_Margin1 (see "ST DETERIORATION CHECK (L/R)" within tERA_Margin1 shown in FIG. 5). At this time, it can be checked whether a threshold voltage of a specific switch transistor is lower than the preset first voltage (L) or higher than the preset second voltage (R). After checking whether the switch transistor included in the corresponding memory block is deteriorated, the memory device 150 may perform a recovery operation on the deteriorated switch transistor (see "ST RECOVERY PROGRAM (L/R)" in FIG. 5). For example, the memory device 150 may increase the threshold voltage of the specific switch transistor using a program pulse ("ST RECOVERY PROGRAM (L)") or may decrease the threshold voltage of the specific switch transistor using an erase pulse ("ST RECOVERY PROGRAM (R)").

Referring to FIGS. 3 and 5, to store more data in the memory device 150, the cell array may have a structure stacked in the vertical direction D1. Accordingly, the number of memory cells and the number of stacks included in the memory block of the memory device 150 may increase. As the number of memory cells and the number of stacks included in the memory block of the memory device 150 increase, a time required or spent to check whether data has been erased in the specific memory block by applying a verification voltage after applying the erase voltage may become longer. If the second section (Verify) where the verification voltage is applied becomes longer, a second operation margin tERA_Margin2 of the erase operation including a time required to check whether the switch transistor is deteriorated ("ST DETERIORATION CHECK (L/R)") and a time to perform a recovery operation for the deteriorated switch transistor ("ST RECOVERY PROGRAM (L/R)") would be increased.

Because these require that the second operation margin tERA_Margin2 of the erase operation corresponding to the erase command (ERS Command) be increased from the first operation margin tERA_Margin1, the operation performance of the memory device 150 could be lowered.

Figure 6:
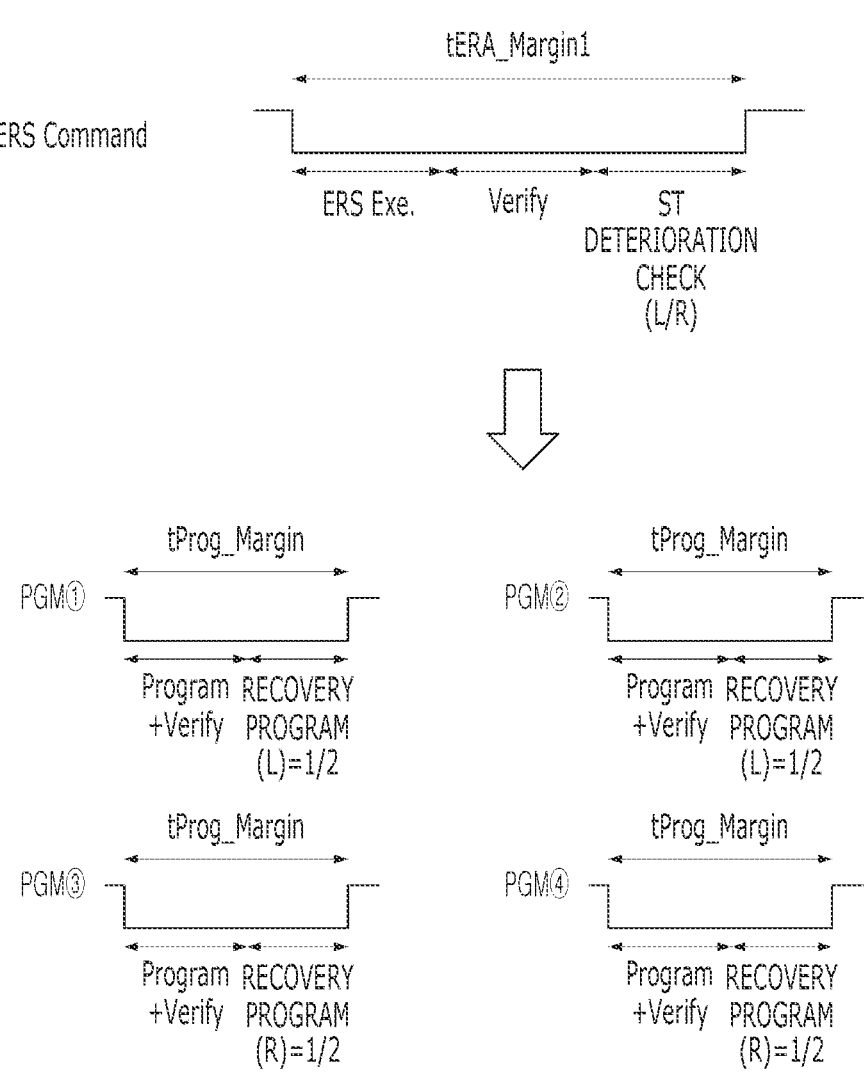
FIG. 6 illustrates the check and recovery operations regarding the operating states of switch transistors during data input/output operations according to an embodiment of the present disclosure.

FIG. 6 illustrates the checking and recovery operations regarding the operating states of switch transistors during data input/output operations according to an embodiment of the present disclosure. The checking and recovery operations for the switch transistors can be distributed over plural input/output operations.

Referring to FIG. 6, the checking and recovery operations regarding the operating states of the switch transistors could be performed separately throughout the erase operation and the program operation. As described above, among the data input/output operations performed in the memory device 150, the operation margins for the erase operation and the program operation may be set to be longer than for another operation. As the number of memory cells and the number of stacks included in the memory block of the memory device 150 increase, it may be difficult to check the operating states of the switch transistors and perform a recovery operation to a deteriorated switch transistor during the first operation margin tERA_Margin1 of the erase operation. The memory device 150 may check the operating states of the switch transistors during the first operation margin tERA_Margin1 of the erase operation and then, perform the recovery operation to the deteriorated switch transistor during an operation margin tProg_Margin of the program operation. Through this way, as described in FIG. 5, there is no need to increase the first operation margin tERA_Margin1 of the erase operation corresponding to the erase command (ERS Command) up to the second operation margin tERA_Margin2, thereby avoiding degradation of operation performance of the memory device 150.

During the first operation margin tERA_Margin1 of the erase operation corresponding to the erase command (ERS Command), the memory device 150 can operate on a specific memory block through the first section to which the erase voltage is applied (ERS Exe.) and the second section to which the verification voltage is applied (Verify). Data stored or remaining in the corresponding memory block can be erased. Thereafter, the memory device 150 can check whether the switch transistors included in the corresponding memory block are deteriorated during the remaining time (see "ST DETERIORATION CHECK (L/R)" in FIG. 6).

As described in FIG. 1, the control circuitry 180 in the memory device 150 may store a result of checking whether at least one switch transistor is deteriorated (i.e., location information of the deteriorated switch transistor) in the recovery buffer 186.

Thereafter, according to an embodiment, the memory device 150 may perform a recovery operation on the deteriorated switch transistor (see "ST RECOVERY PROGRAM (L/R)" in FIG. 6). The operation margin tProg_Margin of the program operation may include a first process (Program) of applying a program pulse to memory cells for storing data and a second process (Verify) of verifying the stored data. The operation margin tProg_Margin of the program operation may be smaller than the first operation margin tERA_Margin1 of the erase operation, so it might be difficult to perform the recovery operation on the deteriorated switch transistors at once. As described above, the memory device 150 may either increase a threshold voltage of a specific switch transistor using a program pulse ("ST RECOVERY PROGRAM (L)") or decrease the threshold voltage of the specific switch transistor using an erase pulse ("ST RECOVERY PROGRAM (R)"). Because there may not be enough time for the recovery operation, the processes of using the program pulse to increase the threshold voltage of the specific switch transistor ("ST RECOVERY PROGRAM (L)") and using the erase pulse to decrease the threshold voltage of the specific switch transistor ("ST RECOVERY PROGRAM (R)") could be divided into several unit operations (e.g., halves of the processes of using the program pulse and the erase pulse: see "ST Recovery PROGRAM (L)=½", "ST Recovery PROGRAM (L)=½", "ST Recovery PROGRAM (R)=½", "ST Recovery PROGRAM (R)=½" in FIG. 6).

According to an embodiment, four program commands PGM①, PGM②, PGM③, PGM④ may be input from a controller (130, see FIGS. 9 and 10) or a host (102, see FIG. 9) external to the memory device 150. Additionally, in another embodiment, the four program commands PGM①, PGM②, PGM③, PGM④ are generated after the memory device 150 receives the erase command (ERS Command) and the program command (PGM Command). The control circuitry 180 can generate four program commands PGM①, PGM②, PGM③, PGM④ based on an operating state of the memory device 150. The program commands PGM①, PGM②, PGM③, PGM④ may cause the respective unit operations ST Recovery PROGRAM (L)=½, ST Recovery PROGRAM (L)=½, ST Recovery PROGRAM (R)=½ and ST Recovery PROGRAM (R)=½.

For convenience of description, an example of performing a single recovery operation divided into two unit operations (i.e., two of "ST Recovery PROGRAM (L)=½" and "ST Recovery PROGRAM (L)=½" and two of "ST Recovery PROGRAM (R)=½" and "ST Recovery PROGRAM (R)=½") is described in FIG. 6. However, the check and recovery operations regarding operating states of the switch transistors can be divided into a plurality of unit operations. Then, the plurality of unit operations can be performed along with the plurality of erase operations, performed separately during each of the first operation margins tERA_Margin1, and the plurality of program operations which are performed separately during each of the operation margins tProg_Margin. Through this way, the memory device 150 does not need to increase the first operation margin tERA_Margin1 of the erase operation and the operation margin tProg_Margin of the program operation even if the number of memory cells and the number of stacks increases, so operational performance of the memory device 150 could be improved.

Figure 7:
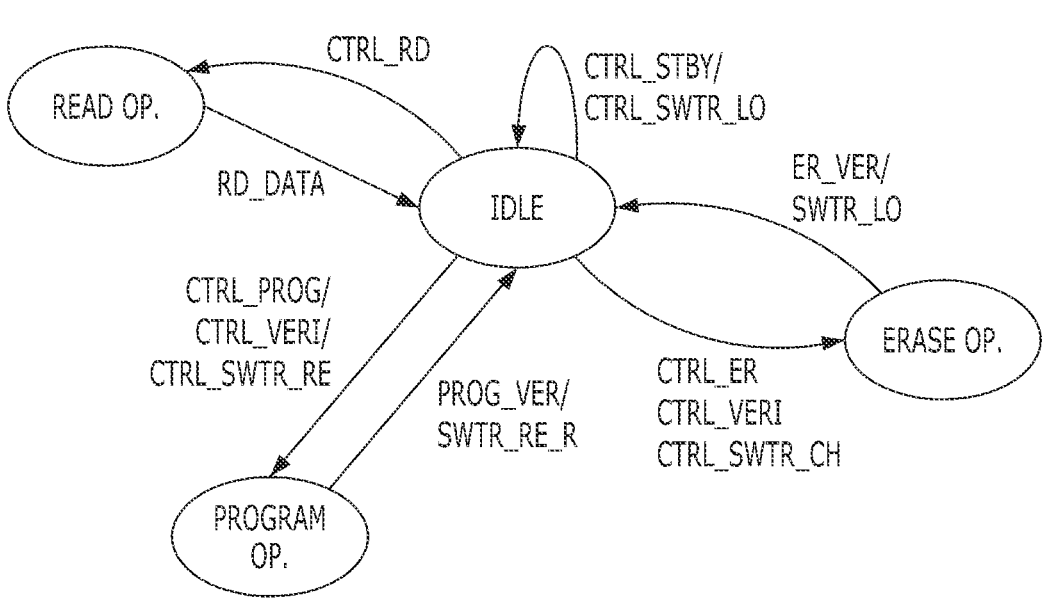
FIG. 7 illustrates a finite state machine included in a memory device according to another embodiment of the present disclosure.

FIG. 7 illustrates a finite state machine included in a memory device according to another embodiment of the present disclosure.

Referring to FIGS. 1 to 3 and 7, the control circuit 180 may include a finite state machine 182 for controlling data input/output operations within the memory device 150.

The control circuitry 180 may generate a control signal CTRL_STBY for a standby state in the idle state IDLE. Additionally, the control circuitry 180 may generate a control signal CTRL_SWTR_LO for controlling location information of switch transistors in the idle state IDLE. At this time, the switch transistors may include a deteriorated switch transistor. The control signal CTRL_SWTR_LO for controlling the location information of the switch transistors is used for a preparatory operation for recovering a threshold voltage of the deteriorated switch transistor by either storing the location information in a buffer or at a preset storage location or adding the location to a data input/output command generated or performed later.

When a read command is input, the control circuitry 180 can generate a read control signal CTRL_RD to perform a read operation READ OP., and after the read operation READ OP. is performed, obtained read data RD_DATA can be output. With the output of the read data RD_DATA, the control circuitry 180 may transition from a state of the read operation READ OP. to the idle state IDLE. According to an embodiment, the operating margin for the read operation READ OP. may not be long as compared to other input/output operations. Thus, a control signal for checking and recovering the operating states of the switch transistors may not be generated or used during a state of the read operation READ OP.

When an erase command is input, the control circuitry 180 may generate an erase control signal CTRL_ER for performing an erase operation ERASE OP. and a verification signal CTRL_VERI for verifying the erase operation. In addition, because the operation margin of the erase operation ERASE OP. is greater than those of other data input/output operations, the control circuitry 180 can generate or use a control signal CTRL_SWTR_CH to check the operating states of the switch transistors. After the erase operation ERASE OP. and verification operation are performed, the control circuitry 180 can check an erase verification result ER_VER. Additionally, based on the control signal CTRL_SWTR_CH for checking the operating states of the switch transistors, the control circuitry 180 may collect location information SWTR_LO of the deteriorated switch transistor.

When a program command is input, the control circuitry 180 may generate a program control signal CTRL_PROG for performing a program operation PROGRAM OP. and a verification signal CTRL_VERI for verifying the program operation. The operation margin for the program operation PROGRAM OP. may be smaller than the operation margin for the erase operation ERASE OP. However, the operation margin for the program operation PROGRAM OP. may be longer than the operation margin for the read operation READ OP. Accordingly, the control circuitry 180 may generate a control signal CTRL_SWTR_RE) for performing a recovery operation to the deteriorated switch transistor during the program operation PROGRAM OP. After the program operation PROGRAM OP. and verification operation are performed, the control circuitry 180 can check a program verification result PROG_VER. Additionally, based on the control signal CTRL_SWTR_RE for performing the recovery operation of the deteriorated switch transistor, the control circuitry 180 can check a recovery result SWTR_RE_R of the switch transistors.

The finite state machine 182 described in FIG. 7 is described as an example and may be modified according to internal components and operating performance of the memory device 150. The memory device 150 may generate a control signal for checking and recovering the operating states of the switch transistors during at least one erase operation ERASE OP. or at least one program operation PROGRAM OP. As described in FIG. 6, control signals for the switch transistor could be generated multiple times for multiple unit operations when the check and recovery operations regarding the operating states of the switch transistors are divided into the multiple unit operations.

Figure 8:
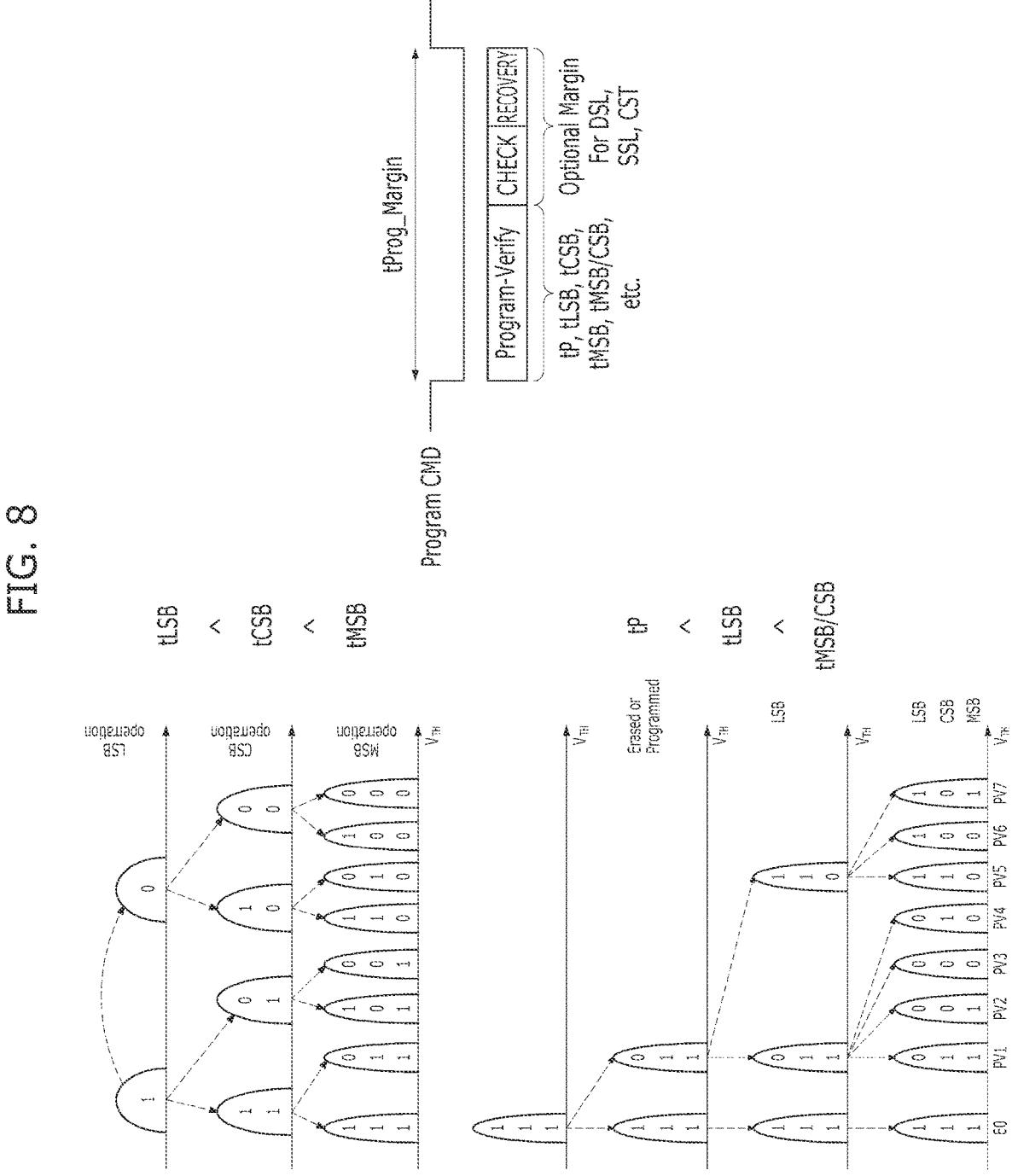
FIG. 8 illustrates the check and recovery operations regarding the operating states of switch transistors during a program operation according to an embodiment of the present disclosure.

FIG. 8 illustrates the check and recovery operations regarding the operating states of switch transistors during a program operation according to an embodiment of the present disclosure.

Referring to FIGS. 1 to 3 and FIG. 8, multi-bit data may be programmed into the plurality of memory cells in the cell array 330. FIG. 8 describes various methods of programming 3 bits of data in each memory cell. Although FIG. 8 illustrates two types of multi-bit data programs, the method of performing a multi-bit data program operation may vary according to an embodiment.

For example, a program operation for storing 3 bits of data in each memory cell can be divided into a unit operation for programming each bit data. The program operation for storing multi-bit data can include an LSB operation for storing LSB (Least Significant Bit) data in each memory cell in the erase state, a CSB operation for storing CSB (Central Significant Bit) data, and an MSB operation for storing MSB (Most Significant Bit) data. When storing LSB, CSB, and MSB data in each memory cell, times tLSB, tCSB, tMSB required or spent to program each data may be different. For example, the time tLSB required to program LSB data may be shorter than the time tCSB required to program CSB data, and the time tCSB required to program CSB data may be shorter than the time tMSB required to program MSB data (i.e., tMSB>tCSB>tLSB).

According to an embodiment, the operation of storing 3 bits of multi-bit data in each memory cell can be divided into three sub operations including a first program operation for distinguishing between two types of memory cells, e.g., a first cell maintained in an erased state and a second cell programmed with one of programmed states (Erased or Programmed), and a second program operation for programming LSB data, and a third program operation for programming the remaining two-bit CSB and MSB data. In this case, times tMSB, tCSB taken to program the two-bit CSB and MSB data may be longer than the time tLSB taken to program the LSB data. The time tLSB taken to program the LSB data may be longer than the time tP taken for the first program operation to distinguish the first cell that is remaining in the erased state from the second cell that is programmed with one of programmed states (i.e., tMSB/tCSB>tLSB>tP).

As described above, the time required may vary depending on which bit of the multi-bit data is programmed in the memory cell during the program operation. However, the operation margin tProg_Margin set for the program operation in the memory device 150 might not vary based on a bit of the multi-bit data to be programmed. The operation margin tProg_Margin may be set the same for all bits of the multi-bit data. Therefore, when a program command (Program CMD) is input, program and verification operations (Program-Verify) are performed on a programmed bit of the multi-bit data during the operation margin tProg_Margin corresponding to the program command (Program CMD). Further, optionally, the memory device 150 can perform the check and recovery operations regarding the operating states of the switch transistors DSL, SSL, CST for the remaining time within the operation margin tProg_Margin.

Depending on the data corresponding to the program command (Program CMD), a remaining time or an optional margin which can be used for checking the operating states of the switch transistors DSL, SSL, CST and performing the recovery operation to the deteriorated switch transistor may vary. Additionally, according to an embodiment, while programming and verification of specific data (e.g., MSB data) is performed, there is insufficient time used for checking the operating states of the switch transistors DSL, SSL, CST and performing the recovery operation to the deteriorated switch transistor. Referring to FIGS. 6 and 8, depending on which bit of the multi-bit data corresponds to the program command (Program CMD), the memory device 150 can check the operating states of the switch transistors DSL, SSL, CST and can perform the recovery operation to the deteriorated switch transistor. The memory device 150 can determine whether to perform some or all of the check and recovery operations regarding the operating states of the switch transistors DSL, SSL, CST.

Figure 9:
FIG. 9 illustrates a memory system according to another embodiment of the present disclosure.

FIG. 9 illustrates a data processing system according to an embodiment of the present disclosure.

Referring to FIG. 9, the data processing system 100 may include a host 102 engaged or coupled with a memory system, such as memory system 110. For example, the host 102 and the memory system 110 can be coupled to each other via a data bus, a host cable and the like to perform data communication.

The memory system 110 may include a memory device 150 and a controller 130. The memory device 150 and the controller 130 in the memory system 110 may be considered components or elements physically separated from each other. The memory device 150 and the controller 130 may be connected via at least one data path. For example, the data path may include a channel and/or a way.

The memory device 150 can include plural memory chips 252 coupled to the controller 130 through plural channels CH0, CH1, . . . , CHn and ways W0, . . . , W_k. The memory chip 252 can include a plurality of memory planes or a plurality of memory dies. According to an embodiment, the memory plane may be considered a logical or a physical partition including at least one memory block, a driving circuit capable of controlling an array including a plurality of non-volatile memory cells, and a buffer that can temporarily store data inputted to, or outputted from, non-volatile memory cells. Each memory plane or each memory die can support an interleaving mode in which plural data input/output operations are performed in parallel or simultaneously. According to an embodiment, memory blocks included in each memory plane, or each memory die, included in the memory device 150 can be grouped to input/output plural data entries as a super memory block. An internal configuration of the memory device 150 shown in FIG. 9 may be changed based on operating performance of the memory system 110. An embodiment of the present disclosure may not be limited to the internal configuration described in FIG. 9.

According to an embodiment, the memory device 150 and the controller 130 may be components or elements functionally divided. Further, according to an embodiment, the memory device 150 and the controller 130 may be implemented with a single chip or a plurality of chips.

The controller 130 may perform a data input/output operation (such as a read operation, a program operation, an erase operation, etc.) in response to a request or a command input from an external device such as the host 102. For example, when the controller 130 performs a read operation in response to a read request input from an external device, data stored in a plurality of non-volatile memory cells included in the memory device 150 is transferred to the controller 130. Further, the controller 130 can independently perform an operation regardless of the request or the command input from the host 102. Regarding an operating state of the memory device 150, the controller 130 can perform an operation such as garbage collection (GC), wear leveling (WL), a bad block management (BBM) for checking whether a memory block is bad and handling a bad block.

Each memory chip 252 can include a plurality of memory blocks. The memory blocks may be understood to be a group of non-volatile memory cells in which data is removed together by a single erase operation. Although not illustrated, the memory block may include a page which is a group of non-volatile memory cells that store data together during a single program operation or output data together during a single read operation. For example, one memory block may include a plurality of pages. The memory device 150 may include a voltage supply circuit capable of supplying at least one voltage into the memory block. The voltage supply circuit may supply a read voltage Vrd, a program voltage Vprog, a pass voltage Vpass, or an erase voltage Vers into a non-volatile memory cell included in the memory block.

The host 102 interworking with the memory system 110, or the data processing system 110 including the memory system 110 and the host 102, is a mobility electronic device (such as a vehicle), a portable electronic device (such as a mobile phone, an MP3 player, a laptop computer, or the like), and a non-portable electronic device (such as a desktop computer, a game machine, a TV, a projector, or the like). The host 102 may provide interaction between the host 102 and a user using the data processing system 100 or the memory system 110 through at least one operating system (OS). The host 102 transmits a plurality of commands corresponding to user's request to the memory system 110, and the memory system 110 performs data input/output operations corresponding to the plurality of commands (e.g., operations corresponding to the user's request).

Referring to FIG. 9, the controller 130 in a memory system operates along with the host 102 and the memory device 150. As illustrated, the controller 130 may have a layered structure including the host interface (HIL) 220, a flash translation layer (FTL) 240, and the memory interface layer or flash interface layer (FIL) 260.

The host interface layer (HIL) 220, the flash translation layer (FTL) 240, and the memory interface layer or flash interface layer (FIL) 260 described in FIG. 9 are illustrated as one embodiment. The host interface layer (HIL) 220, the flash translation layer (FTL) 240, and the flash interface layer (FIL) 260 may be implemented in various forms according to the operating performance of the memory system 110. According to an embodiment, the host interface layer (HIL) 220, the flash translation layer (FTL) 240, and the flash interface layer (FIL) 260 can perform operations through multi cores or processors having a pipelined structure included in the controller 130.

The host 102 and the memory system 110 may use a predetermined set of rules or procedures for data communication or a preset interface to transmit and receive data therebetween. Examples of sets of rules or procedures for data communication standards or interfaces supported by the host 102 and the memory system 110 for sending and receiving data include Universal Serial Bus (USB), Multi-Media Card (MMC), Parallel Advanced Technology Attachment (PATA), Small Computer System Interface (SCSI), Enhanced Small Disk Interface (ESDI), Integrated Drive Electronics (IDE), Peripheral Component Interconnect Express (PCIe or PCI-e), Serial-attached SCSI (SAS), Serial Advanced Technology Attachment (SATA), Mobile Industry Processor Interface (MIPI), and the like. According to an embodiment, the host 102 and the memory system 110 may be coupled to each other through a Universal Serial Bus (USB). The Universal Serial Bus (USB) is a highly scalable, hot-pluggable, plug-and-play serial interface that ensures cost-effective, standard connectivity to peripheral devices such as keyboards, mice, joysticks, printers, scanners, storage devices, modems, video conferencing cameras, and the like.

The memory system 110 may support the non-volatile memory express (NVMe). The Non-volatile memory express (NVMe) is a type of interface based at least on a Peripheral Component Interconnect Express (PCIe) designed to increase performance and design flexibility of the host 102, servers, computing devices, and the like equipped with the non-volatile memory system 110. The PCIe can use a slot or a specific cable for connecting a computing device (e.g., host 102) and a peripheral device (e.g., memory system 110). For example, the PCIe can use a plurality of pins (e.g., 18 pins, 32 pins, 49 pins, or 82 pins) and at least one wire (e.g., ×1, ×4, ×8, or ×16) to achieve high speed data communication over several hundred MB per second. According to an embodiment, the PCIe scheme may achieve bandwidths of tens to hundreds of Giga bits per second.

A buffer manager 280 in the controller 130 can control the input/output of data or operation information in conjunction with the host interface layer (HIL) 220, the flash translation layer (FTL) 240, and the memory interface layer or flash interface layer (FIL) 260. To this end, the buffer manager 280 can set or establish various buffers, caches, or queues in a memory, and control data input/output of the buffers, the caches, or the queues, or data transmission between the buffers, the caches, or the queues in response to a request or a command generated by the host interface layer (HIL) 220, the flash translation layer (FTL) 240, and the memory interface layer or flash interface layer (FIL) 260. For example, the controller 130 may temporarily store read data provided from the memory device 150 in response to a request from the host 102 before providing the read data to the host 102. Also, the controller 130 may temporarily store write data provided from the host 102 in a memory before storing the write data in the memory device 150. When controlling operations such as a read operation, a program operation, and an erase operation performed within the memory device 150, the read data or the write data transmitted or generated between the controller 130 and the memory device 150 in the memory system 110 could be stored and managed in a buffer, a queue, etc. established in the memory by the buffer manager 280. Besides the read data or the write data, the buffer manager 280 can store signal or information (e.g., map data, a read command, a program command, or etc. which is used for performing operations such as programming and reading data between the host 102 and the memory device 150) in the buffer, the cache, the queue, etc. established in the memory. The buffer manager 280 can set, or manage, a command queue, a program memory, a data memory, a write buffer/cache, a read buffer/cache, a data buffer/cache, a map buffer/cache, and etc.

The host interface layer (HIL) 220 may handle commands, data, and the like transmitted from the host 102. By way of example but not limitation, the host interface layer 220 may include a command queue manager 222 and an event queue manager 224. The command queue manager 222 may sequentially store the commands, the data, and the like received from the host 102 in a command queue, and output them to the event queue manager 224, for example, in an order in which they are stored in the command queue manager 222. The event queue manager 224 may sequentially transmit events for processing the commands, the data, and the like received from the command queue. According to an embodiment, the event queue manager 224 may classify, manage, or adjust the commands, the data, and the like received from the command queue. Further, according to an embodiment, the host interface layer 220 can include an encryption manager 226 configured to encrypt a response or output data to be transmitted to the host 102 or to decrypt an encrypted portion in the command or data transmitted from the host 102.

A plurality of commands or data of the same characteristic may be transmitted from the host 102, or a plurality of commands and data of different characteristics may be transmitted to the memory system 110 after being mixed or jumbled by the host 102. For example, a plurality of commands for reading data, i.e., read commands, may be delivered, or commands for reading data, i.e., a read command, and a command for programming/writing data, i.e., a write command, may be alternately transmitted to the memory system 110. The command queue manager 222 of the host interface layer 220 may sequentially store commands, data, and the like, which are transmitted from the host 102, in the command queue. Thereafter, the host interface layer 220 may estimate or predict what type of internal operations the controller 130 will perform according to the characteristics of the commands, the data, and the like, which have been transmitted from the host 102. The host interface layer 220 may determine a processing order and a priority of commands, data and the like based on their characteristics. According to the characteristics of the commands, the data, and the like transmitted from the host 102, the event queue manager 224 in the host interface layer 220 is configured to receive an event, which should be processed or handled internally within the memory system 110 or the controller 130 according to the commands, the data, and the like input from the host 102, from the buffer manager 280. Then, the event queue manager 224 can transfer the event including the commands, the data, and the like into the flash translation layer (FTL) 240.

According to an embodiment, the flash translation layer (FTL) 240 may include a host request manager (HRM) 242, a map manager (MM) 244, a state manager 246, and a block manager 248. Further, according to an embodiment, the flash translation layer (FTL) 240 may implement a multi-thread scheme to perform data input/output (I/O) operations. A multi-thread FTL may be implemented through a multi-core processor using multi-thread included in the controller 130. For example, the host request manager (HRM) 242 may manage the events transmitted from the event queue. The map manager (MM) 244 may handle or control map data. The state manager 246 may perform an operation such as garbage collection (GC) or wear leveling (WL), after checking an operating state of the memory device 150. The block manager 248 may execute commands or instructions onto a block in the memory device 150.

The host request manager (HRM) 242 may use the map manager (MM) 244 and the block manager 248 to handle or process requests according to read and program commands and events which are delivered from the host interface layer 220. The host request manager (HRM) 242 may send an inquiry request to the map manager (MM) 244 to determine a physical address corresponding to a logical address which is entered with the events. The host request manager (HRM) 242 may send a read request with the physical address to the memory interface layer 260 to process the read request, i.e., handle the events. In one embodiment, the host request manager (HRM) 242 may send a program request (or a write request) to the block manager 248 to program data to a specific empty page storing no data in the memory device 150, and then may transmit a map update request corresponding to the program request to the map manager (MM) 244 in order to update an item relevant to the programmed data in information of mapping the logical and physical addresses to each other.

The block manager 248 may convert a program request delivered from the host request manager (HRM) 242, the map manager (MM) 244, and/or the state manager 246 into a flash program request used for the memory device 150, to manage flash blocks in the memory device 150. To maximize or enhance program or write performance of the memory system 110, the block manager 248 may collect program requests and send flash program requests for multiple-plane and one-shot program operations to the memory interface layer 260. In an embodiment, the block manager 248 sends several flash program requests to the memory interface layer 260 to enhance or maximize parallel processing of a multi-channel and multi-directional flash controller.

In an embodiment, the block manager 248 may manage blocks in the memory device 150 according to the number of valid pages, select and erase blocks having no valid pages when a free block is needed and select a block including the least number of valid pages when it is determined that garbage collection is to be performed. The state manager 246 may perform garbage collection to move valid data stored in the selected block to an empty block and erase data stored in the selected block so that the memory device 150 may have enough free blocks (i.e., empty blocks with no data).

When the block manager 248 provides information regarding a block to be erased to the state manager 246, the state manager 246 may check all flash pages of the block to be erased to determine whether each page of the block is valid. For example, to determine validity of each page, the state manager 246 may identify a logical address recorded in an out-of-band (OOB) area of each page. To determine whether each page is valid, the state manager 246 may compare a physical address of the page with a physical address mapped to a logical address obtained from an inquiry request. The state manager 246 sends a program request to the block manager 248 for each valid page. A map table may be updated by the map manager 244 when a program operation is complete.

The map manager 244 may manage map data, e.g., a logical-physical map table. The map manager 244 may process various requests, for example, queries, updates, and the like, which are generated by the host request manager (HRM) 242 or the state manager 246. The map manager 244 may store the entire map table in the memory device 150, e.g., a flash/non-volatile memory, and cache mapping entries according to the storage capacity of the memory 144. When a map cache miss occurs while processing inquiry or update requests, the map manager 244 may send a read request to the memory interface layer 260 to load a relevant map table stored in the memory device 150. When the number of dirty cache blocks in the map manager 244 exceeds a certain threshold value, a program request may be sent to the block manager 246, so that a clean cache block is made and a dirty map table may be stored in the memory device 150.

When garbage collection is performed, the state manager 246 copies valid page(s) into a free block, and the host request manager (HRM) 242 may program the latest version of the data for the same logical address of the page and concurrently issue an update request. When the state manager 246 requests the map update in a state in which the copying of the valid page(s) is not completed normally, the map manager 244 may not perform the map table update. This is because the map request is issued with old physical information when the state manger 246 requests a map update and a valid page copy is completed later. The map manager 244 may perform a map update operation to ensure accuracy when, or only if, the latest map table still points to the old physical address.

The memory interface layer or flash interface layer (FIL) 260 may exchange data, commands, state information, and the like, with a plurality of memory chips 252 in the memory device 150 through a data communication method. According to an embodiment, the memory interface layer 260 may include a status check schedule manager 262 and a data path manager 264. The status check schedule manager 262 can check and determine the operating state regarding the plurality of memory chips 252 coupled to the controller 130, the operating state regarding a plurality of channels CH0, CH1, . . . , CHn and the plurality of ways W0, . . . , W_k, and the like. The transmission and reception of data or commands can be scheduled in response to the operating states regarding the plurality of memory chips 252 and the plurality of channels CH0, CH1, . . . , CHn. The data path manager 264 can control the transmission and reception of data, commands, etc. through the plurality of channels CH0, CH1, . . . , CHn and ways W0, . . . , W_k based on the information transmitted from the status check schedule manager 262. According to an embodiment, the data path manager 264 may include a plurality of transceivers, each transceiver corresponding to each of the plurality of channels CH0, CH1, . . . , CHn. Further, according to an embodiment, the status check schedule manager 262 and the data path manager 264 included in the memory interface layer 260 could be implemented as, or engaged with, a memory control sequence generator.

According to an embodiment, the memory interface layer 260 may further include ECC (error correction code) circuitry 266 configured to perform error checking and correction of data transferred between the controller 130 and the memory device 150. The ECC unit 266 may be implemented as a separate module, circuit, or firmware in the controller 130, but may also be implemented in each memory chip 252 included in the memory device 150 according to an embodiment. The ECC circuitry 266 may include a program, a circuit, a module, a system, or an apparatus for detecting and correcting an error bit of data processed by the memory device 150.

For finding and correcting any error of data transferred from the memory device 150, the ECC circuitry 266 can include an error correction code (ECC) encoder and an ECC decoder. The ECC encoder may perform error correction encoding of data to be programmed in the memory device 150 to generate encoded data into which a parity bit is added and store the encoded data in the memory device 150. The ECC decoder can detect and correct error bits contained in the data read from the memory device 150 when the controller 130 reads the data stored in the memory device 150. For example, after performing error correction decoding on the data read from the memory device 150, the ECC circuitry 266 can determine whether the error correction decoding has succeeded or not, and outputs an instruction signal, e.g., a correction success signal or a correction fail signal, based on a result of the error correction decoding. The ECC circuitry 266 may use a parity bit, which has been generated during the ECC encoding process for the data stored in the memory device 150, to correct the error bits of the read data entries. When the number of the error bits is greater than or equal to the number of correctable error bits, the ECC circuitry 138 may not correct the error bits and instead may output the correction fail signal indicating failure in correcting the error bits.

According to an embodiment, the error correction circuitry 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), or the like. The error correction circuitry 138 may include all circuits, modules, systems, and/or devices for performing the error correction operation based on at least one of the above-described codes.

For example, the encoder in the ECC circuitry 266 may generate a codeword that is a unit of ECC-applied data. A codeword of length n bits may include k bits of user data and (n-k) bits of parity. A code rate may be calculated as (k/n). The higher the code rate, the more user data that can be stored in a given codeword. When the length of the codeword is longer and the code rate is smaller, the error correction capability of the ECC circuitry 266 could be improved. In addition, the ECC circuitry 266 performs decoding using information read from the channels CH0, CH1, . . . , CHn. The decoder in the ECC circuitry 266 can be classified into a hard decision decoder and a soft decision decoder according to how many bits represent the information to be decoded. A hard decision decoder performs decoding with a memory cell output information expressed in 1 bit, and the 1-bit information used at this time is called hard decision information. A soft decision decoder uses more accurate memory cell output information composed of 2 bits or more, and this information is called soft decision information. The ECC circuitry 266 may correct errors included in data using the hard decision information or the soft decision information.

According to an embodiment, to increase the error correction capability, the ECC circuitry 266 may use a concatenated code using two or more codes. In addition, the ECC circuitry 266 may use a product code that divides one codeword into several rows and columns and applies a different relatively short ECC to each row and column.

In accordance with an embodiment, a manager included in the host interface layer 220, the flash translation layer (FTL) 240, and the memory interface layer or flash interface layer (FIL) 260 could be implemented with a general processor, an accelerator, a dedicated processor, a co-processor, a multi-core processor, or the like. According to an embodiment, the manager can be implemented with firmware working with a processor.

According to an embodiment, the memory device 150 is embodied as a non-volatile memory such as a flash memory, for example, a Read Only Memory (ROM), a Mask ROM (MROM), a Programmable ROM (PROM), an Erasable ROM (EPROM), an Electrically Erasable ROM (EE-PROM), a Magnetic (MRAM), a NAND flash memory, a NOR flash memory, or the like. In another embodiment, the memory device 150 may be implemented by at least one of a phase change random access memory (PCRAM), a Resistive Random Access Memory (ReRAM), a ferroelectrics random access memory (FRAM), a transfer torque random access memory (STT-RAM), and a spin transfer torque magnetic random access memory (STT-MRAM), or the like.

Figure 10:
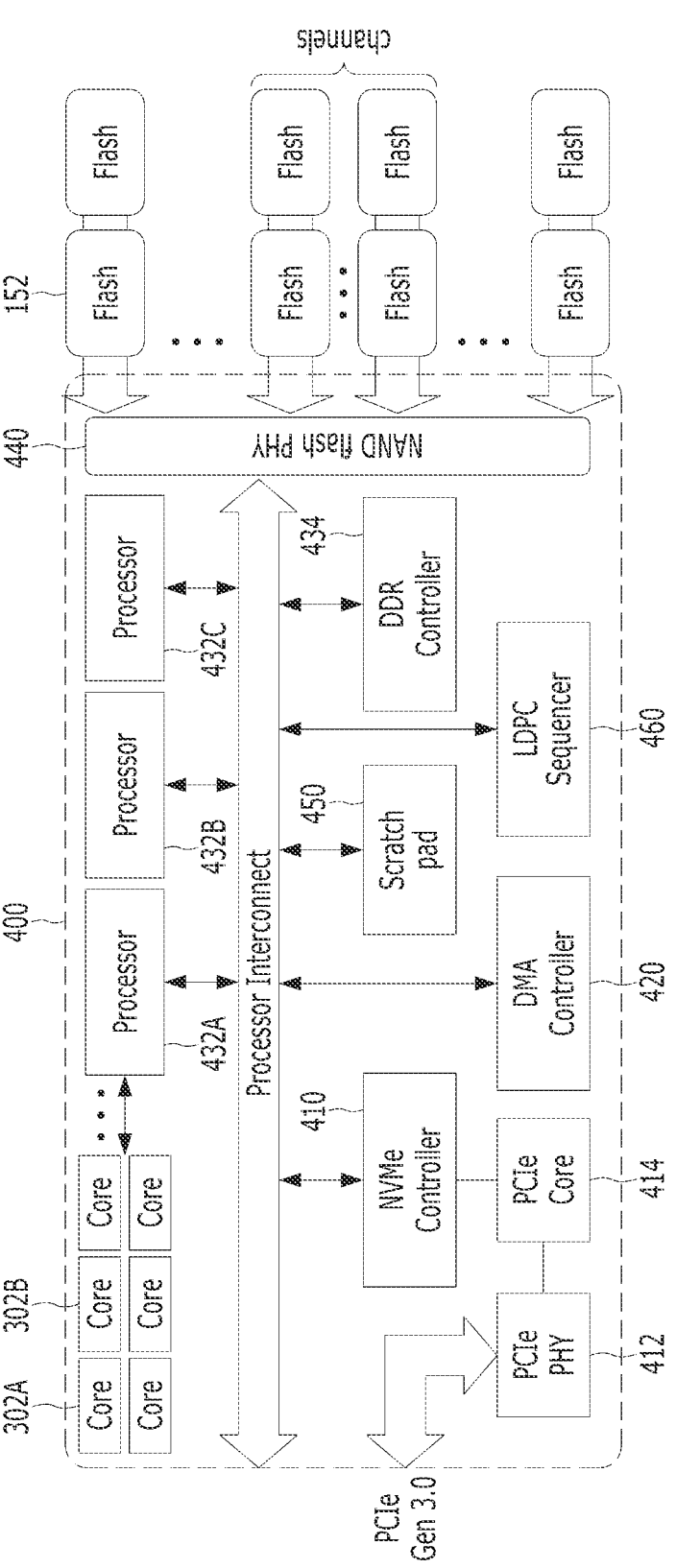
FIG. 10 illustrates a memory system according to another embodiment of the present disclosure.

FIG. 10 illustrates a data storage system according to an embodiment of the present disclosure. FIG. 10 shows a memory system including multiple cores or multiple processors, which is an example of a data storage system. The memory system may support the Non-Volatile Memory Express (NVMe) protocol.

The NVMe is a type of transfer protocol designed for a solid-state memory that could operate much faster than a conventional hard drive. The NVMe can support higher input/output operations per second (IOPS) and lower latency, resulting in faster data transfer speeds and improved overall performance of the data storage system. Unlike SATA which has been designed for a hard drive, the NVMe can leverage the parallelism of solid-state storage to enable more efficient use of multiple queues and processors (e.g., CPUs). The NVMe is designed to allow hosts to use many threads to achieve higher bandwidth. The NVMe can allow the full level of parallelism offered by SSDs to be fully exploited. However, because of limited firmware scalability, limited computational power, and high hardware contention within SSDs, the memory system might not process a large number of I/O requests in parallel.

Referring to FIG. 10, the host, which is an external device, can be coupled to the memory system through a plurality of PCIe Gen 3.0 lanes, a PCIe physical layer 412, and a PCIe core 414. A controller 400 may include three embedded processors 432A, 432B, 432C, each using two cores 302A, 302B. Herein, the plurality of cores 302A, 302B or the plurality of embedded processors 432A, 432B, 432C may have a pipeline structure.

The plurality of embedded processors 432A, 432B, 432C may be coupled to the internal DRAM controller 434 through a processor interconnect. The controller 400 further includes a Low Density Parity-Check (LDPC) sequencer 460, a Direct Memory Access (DMA) engine 420, a scratch pad memory 450 for metadata management, and an NVMe controller 410. Components within the controller 400 may be coupled to a plurality of channels connected to a plurality of memory packages 152 through a flash physical layer 440. The plurality of memory packages 152 may correspond to the plurality of memory chips 252 described in FIG. 9.

According to an embodiment, the NVMe controller 410 included in the controller 400 is a type of storage controller designed for use with solid state drives (SSDs) that use an NVMe interface. The NVMe controller 410 may manage data transfer between the SSD and the computer CPU as well as other functions such as error correction, wear leveling, and power management. The NVMe controller 410 may use a simplified, low-overhead protocol to support fast data transfer rates.

According to an embodiment, a scratch pad memory 450 may be a storage area set by the NVMe controller 410 to temporarily store data. The scratch pad memory 450 may be used to store data waiting to be written to a plurality of memory packages 152. The scratch pad memory 450 can also be used as a buffer to speed up the writing process, typically with a small amount of Dynamic Random Access Memory (DRAM) or Static Random Access Memory (SRAM). When a write command is executed, data may first be written to the scratch pad memory 450 and then transferred to the plurality of memory packages 152 in larger blocks. The scratch pad memory 450 may be used as a temporary memory buffer to help optimize the write performance of the plurality of memory packages 152. The scratch pad memory 450 may serve as intermediate storage of data before the data is written to non-volatile memory cells.

The Direct Memory Access (DMA) engine 420 included in the controller 400 is a component that transfers data between the NVMe controller 410 and a host memory in the host system without involving a host's processor. The DMA engine 420 can support the NVMe controller 410 to directly read or write data from or to the host memory without intervention of the host's processor. According to an embodiment, the DMA engine 420 may achieve or support high-speed data transfer between a host and an NVMe device, using a DMA descriptor that includes information regarding data transfer such as a buffer address, a transfer length, and other control information.

The Low Density Parity Check (LDPC) sequencer 460 in the controller 400 is a component that performs error correction on data stored in the plurality of memory packages 152. Herein, an LDPC code is a type of error correction code commonly used in a NAND flash memory to reduce a bit error rate. The LDPC sequencer 460 may be designed to immediately process encoding and decoding of LDPC codes when reading and writing data from and to the NAND flash memory. According to an embodiment, the LDPC sequencer 460 may divide data into plural blocks, encode each block using an LDPC code, and store the encoded data in the plurality of memory packages 152. Thereafter, when reading the encoded data from the plurality of memory packages 152, the LDPC sequencer 460 can decode the encoded data based on the LDPC code and correct errors that may have occurred during a write or read operation. The LDPC sequencer 460 may correspond to the ECC module 266 described in FIG. 9.

In addition, although FIGS. 9 and 10 illustrate an example of a memory system including a memory device 150 or a plurality of memory packages 152 capable of storing data, the data storage system according to an embodiment of the present disclosure may not be limited to the memory system described in FIGS. 9 and 10. For example, the memory device 150, the plurality of memory packages 152, or the data storage device controlled by the controllers 130, 400 may include non-volatile or non-volatile memory devices. In FIG. 10, it is described that the controller 400 can perform data communication with the host 102 externally placed from the memory system (see FIG. 9) through an NVM Express (NVMe) interface and a PCI Express (PCIe). In an embodiment, the controller 400 may perform data communication with at least one host through a protocol such as a Compute Express Link (CXL).

Additionally, according to an embodiment, an apparatus and method for performing distributed processing or allocation/reallocation of the plurality of instructions in a controller including multi processors of the pipelined structure according to an embodiment of the present disclosure can be applicable to a data processing system including a plurality of memory systems or a plurality of data storage devices. For example, a Memory Pool System (MPS) is a very general, adaptable, flexible, reliable and efficient memory management system where a memory pool such as a logical partition of primary memory or storage reserved for processing a task or group of tasks could be used to control or manage a storage device coupled to the controller. The controller including multi processors in the pipelined structure can control data and program transfer to the memory pool controlled or managed by the memory pool system (MPS).

Figure 11:
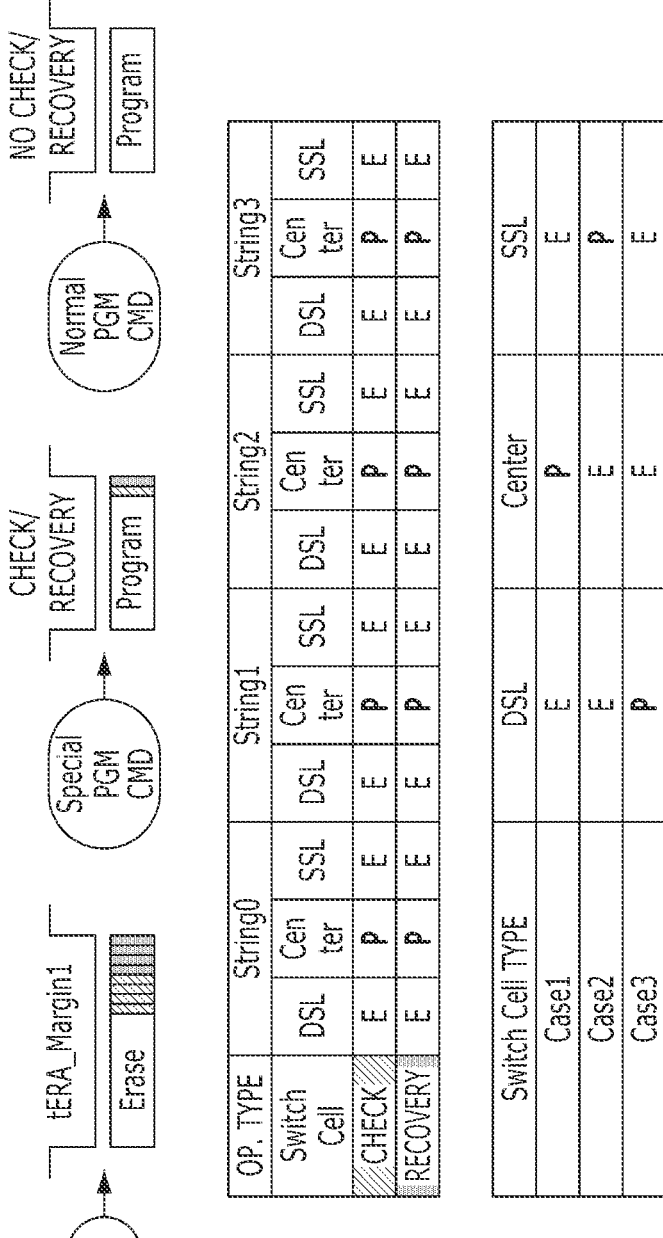
FIG. 11 illustrates a first example of the check and recovery operations regarding the operating states of switch transistors during data input/output operations according to an embodiment of the present disclosure.

FIG. 11 illustrates a first example of the check and recovery operations regarding the operating states of switch transistors during data input/output operations according to an embodiment of the present disclosure.

Referring to FIGS. 1 to 11, the memory device 150 or the memory system 110 may receive a special program command (Special PGM CMD) from the controller 130 or the host 102. Additionally, the controller 130 or the host 102 can generate an erase command (Erase CMD) and a general program command (Normal PGM CMD).

As described in FIGS. 5 and 6, the memory device 150 can perform the erase operation corresponding to the erase command (Erase CMD) during the first operation margin tERA_Margin1, and then check the operating states of the switch transistors and perform the recovery operation to the deteriorated switch transistor during a remaining time of the first operation margin tERA_Margin1. In addition, the memory device 150 does not perform the check and recovery operations regarding operating states of the switch transistor during an operation margin of the program operation corresponding to the general program command (Normal PGM CMD). However, the memory device 150 can perform the check and recovery operations regarding operating states of the switch transistor during an operation margin of the program operation corresponding to the special program command (Special PGM CMD).

Referring to FIG. 11, a specific memory block included in the memory device 150 may include four cell strings String0, String1, String2, String3. Each cell string String0, String1, String2, String3 may include a drain select transistor DST, a source select transistor SST, and an central switching transistor CST. As described in FIG. 5, it may be difficult to perform both the check and recovery operations regarding operating states of the drain select transistor DST, the source select transistor SST, and the central switching transistor CST included in each cell string String0, String1, String2, String3 during the first operation margin tERA_Margin1 corresponding to the erase command (Erase CMD).

Referring to FIG. 11, the check (e.g., read) and recovery operations regarding the operating states of the drain select transistor DST and source select transistor SST included in each cell string String0, String1, String2, String3 can be performed during the first operation margin tERA_Margin1 corresponding to the erase command (Erase CMD). On the other hand, the check (i.e., read) and recovery operations regarding the operating state of the central switching transistor CST included in each cell string String0, String1, String2, String3 can be performed during a program operation corresponding to the special program command (Special PGM CMD).

According to some embodiments Case1, Case2, Case3, a target may be changed for the check and recovery operations regarding the operating states of the switch transistors performed during the first operation margin tERA_Margin1 corresponding to the erase command (Erase CMD) and an operation margin of the program operation corresponding to the special program command (Special PGM CMD). For example, in a first case Case1, the check and recovery operations regarding the operating states of the drain select transistor DST and the source select transistor SST can be performed during the first operation margin tERA_Margin1 corresponding to the erase command (Erase CMD), and the check and recovery operations regarding the operating states of the central switching transistor CST may be performed during the operation margin of the program operation corresponding to the special program command (Special PGM CMD). In a second case Case2, the check and recovery operations regarding the operating state of the drain select transistor DST and the central switching transistor CST may be performed during the first operation margin tERA_Margin1 corresponding to the erase command (Erase CMD), and the check and recovery operations regarding the operating state of the source select transistor SST can be performed during the operation margin of the program operation corresponding to the special program command (Special PGM CMD). In a third case Case3, the check and recovery operations regarding the operating states of the central switching transistor CST and the source select transistor SST can be performed during the first operation margin tERA_Margin1 corresponding to the erase command (Erase CMD), and the check and recovery operations regarding the operating state of the drain select transistor DST can be performed during the operation margin of the program operation corresponding to the special program command (Special PGM CMD).

Referring to FIG. 11, the memory device 150 can perform the check and recovery operations regarding the operating states of the switch transistors based on a location or a type of the switch transistor included in each cell string String0, String1, String2, String3 during an operation margin set for a specific data input/output operation. The check and recovery operations regarding the operating states of the switch transistors can be performed separately based on the target (e.g., one of the switch transistors included in each cell string String0, String1, String2, String3).

Figure 12:
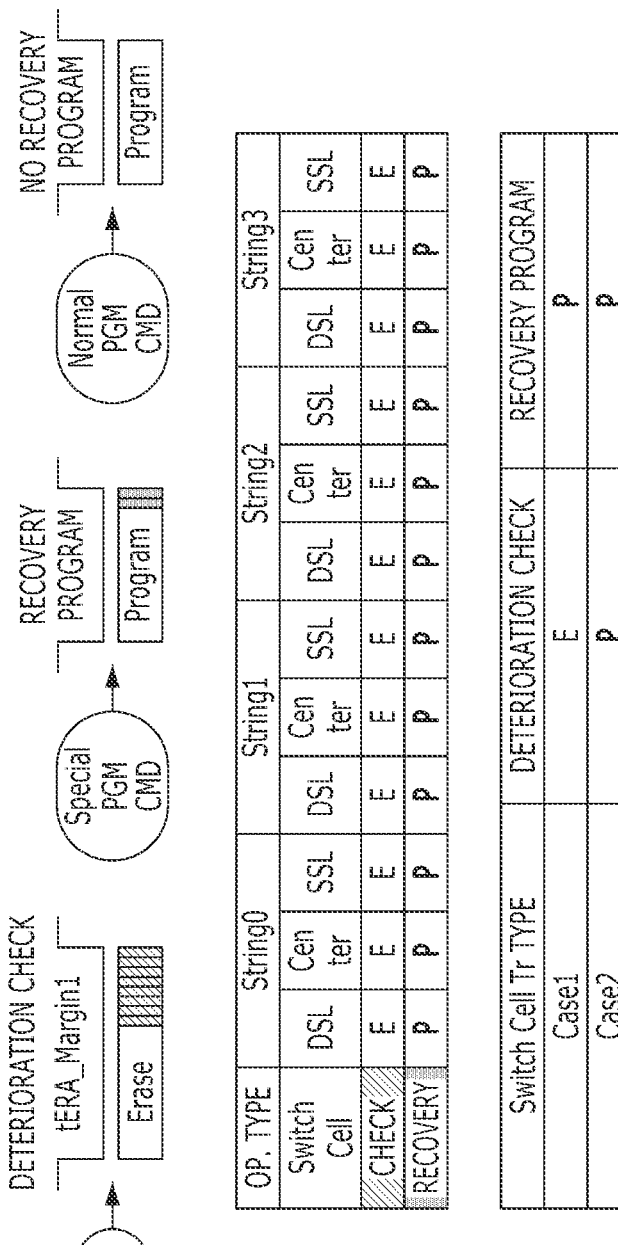
FIG. 12 illustrates a second example of the check and recovery operations regarding the operating states of switch transistors during data input/output operations according to an embodiment of the present disclosure.

FIG. 12 illustrates a second example of the check and recovery operations regarding the operating states of switch transistors during data input/output operations according to an embodiment of the present disclosure.

Referring to FIGS. 1 to 12, the memory device 150 or the memory system 110 may receive a special program command (Special PGM CMD) from the controller 130 or the host 102. Further, the controller 130 or the host 102 can generate an erase command (Erase CMD) and a general program command (Normal PGM CMD).

As described in FIG. 11, the memory device 150 may perform the erase operation during the first operation margin tERA_Margin1 corresponding to the erase command (Erase CMD) and perform the check operation regarding the operating state of the switch transistor during a remaining time of the first operation margin tERA_Margin1. In addition, the memory device 150 does not perform the check and recovery operations regarding the operating states of the switch transistors during the operating margin of the program operation corresponding to the general program command (Normal PGM CMD). However, the memory device 150 can perform the recovery operation regarding the operating states of the switch transistors during the operation margin of the program operation corresponding to the special program command (Special PGM CMD).

Referring to FIG. 12, a specific memory block included in the memory device 150 can include four cell strings String0, String1, String2, String3. Each cell string String0, String1, String2, String3 can include a drain select transistor DST, a source select transistor SST, and a central switching transistor CST. As described in FIG. 5, it may be difficult to perform both the check and recovery operations regarding the operating states of the drain select transistor DST, the source select transistor SST, and the central switching transistor CST included in each cell string String0, String1, String2, String3 during the first operation margin tERA_Margin1 corresponding to the erase command (Erase CMD).

Referring to FIG. 12, the operating states of the drain select transistor DST, the source select transistor SST, and the central switching transistor CST included in each cell string String0, String1, String2, String3 can be checked during the first operation margin tERA_Margin1 corresponding to the erase command (Erase CMD). On the other hand, the recovery operation for the drain select transistor DST, the source select transistor SST, and the central switching transistor CST included in each cell string String0, String1, String2, String3 can be performed during the operation margin of the program operation in response to the special program command (Special PGM CMD).

According to an embodiment Case1, Case2, a target can be changed for the check and recovery operation regarding the operating states of the switch transistors performed during the first operation margin tERA_Margin1 corresponding to the erase command (Erase CMD) and the operation margin set for the program operation corresponding to the special program command (Special PGM CMD). For example, in a first case Case1, the check operation regarding the operating states of the drain select transistor DST, the source select transistor SST, and the central switching transistor CST can be performed during the first operation margin tERA_Margin1 corresponding to the erase command (Erase CMD). Then, the recovery operation for the drain select transistor DST, the source select transistor SST, and the central switching transistor CST can be performed during the operation margin of the program operation corresponding to the special program commands (Special PGM CMD). In a second case Case2, the check (i.e., read) and recovery operations regarding the operating states of the drain select transistor DST, the source select transistor SST, and the central switching transistor CST can be performed during the operation margins of the program operations corresponding to the special program instructions (Special PGM CMD).

Referring to FIG. 12, the memory device 150 can divide the check and recovery operations regarding the operating states of the switch transistors included in each cell string String0, String1, String2, String3 into plural unit operations. During operation margins set for plural specific data input/output operations, the plural unit operations could be performed individually. That is, the operations to check (i.e., read) the operating states of the switch transistors and recover the operating state of the deteriorated switch transistor may be performed within the operation margins predetermined for performing plural data input/output operations.

As above described, a memory device or a memory system according to an embodiment of the present disclosure can maintain and manage an operating state of a switch transistor coupled to a memory cell, while reducing an impact on data input/output performance of the memory device or the memory system.

Further, the memory device or the memory system according to an embodiment of the present disclosure can reduce an error that may occur in data input/output operations.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods or operations of the computer, processor, controller, or other signal processing device, are described in detail, the code or instructions for implementing the operations of the method embodiments may transform the computer, processor, controller, or other signal processing device into a special-purpose processor for performing the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments herein.

The controllers, processors, control circuitry, devices, modules, units, multiplexers, generators, logic, interfaces, decoders, drivers, and other signal generating and signal processing features of the embodiments disclosed herein may be implemented, for example, in non-transitory logic that may include hardware, software, or both. When implemented at least partially in hardware, the controllers, processors, control circuitry, devices, modules, units, multiplexers, generators, logic, interfaces, decoders, drivers, and other signal generating and signal processing features may be, for example, any of a variety of integrated circuits including but not limited to an application-specific integrated circuit, a field-programmable gate array, a combination of logic gates, a system-on-chip, a microprocessor, or another type of processing or control circuit.

When implemented at least partially in software, the controllers, processors, control circuitry, devices, modules, units, multiplexers, generators, logic, interfaces, decoders, drivers, and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods or operations of the computer, processor, microprocessor, controller, or other signal processing device, are described in detail, the code or instructions for implementing the operations of the method embodiments may transform the computer, processor, controller, or other signal processing device into a special-purpose processor for performing the methods described herein.

While the present teachings have been illustrated and described with respect to the specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. A memory device comprising:
a cell array comprising plural memory cells and plural switch transistors; and
control circuitry configured to perform at least one of a checking operation and a recovery operation regarding the plural switch transistors during operation margins set for plural data input/output operations performed in the cell array, wherein the checking operation checks threshold voltages of the plural switch transistors to determine whether the plural switch transistors are deteriorated and the recovery operation shifts a threshold voltage of a deteriorated switch transistor among the plural switch transistors,
wherein the control circuitry is configured to perform the checking operation during operation margins based on a programmed data value of plural program operations.

2. The memory device according to claim 1, wherein the plural switch transistors comprise:
at least one drain select transistor configured to control connection between the plural memory cells and a bit line;
at least one source select transistor configured to control connection between the plural memory cells and a common source line; and
at least one central switching transistor disposed between the plural memory cells.

3. The memory device according to claim 2, wherein the at least one central switching transistor is disposed between two vertically stacked portions each comprising at least some of the plural memory cells.

4. The memory device according to claim 1, wherein the plural data input/output operations comprise:
one or more erase operations for erasing data remained in the plural memory cells; and
one or more program operations for programming data in the plural memory cells.

5. The memory device according to claim 4, wherein the control circuitry is configured to perform the checking operation during an operation margin set for the one or more erase operations and the recovery operation during an operation margin set for the one or more program operations.

6. The memory device according to claim 1, wherein the control circuitry is configured to divide the at least one of the checking operation and the recovery operation into plural unit operations based on locations of the plural switch transistors.

7. The memory device according to claim 6, wherein the control circuitry is configured to perform the unit operations for each of the plural switch transistors during the operation margin set for each of the plural data input/output operations.

8. The memory device according to claim 6, wherein the control circuitry is configured to perform the unit operations on a single switch transistor during the operation margins set for the plural data input/output operations.

9. The memory device according to claim 1, further comprising a buffer configured to store location information of deteriorated switch transistors among the plural switch transistors.

10. The memory device according to claim 9, wherein the control circuitry is configured to generate a switch transistor recovery command comprising the location information, based on which one of the plural data input/output operations is performed in the cell array.

11. The memory device according to claim 1, wherein the control circuitry is configured to generate a control signal for the checking operation when an erase command is input.

12. The memory device according to claim 1, wherein the control circuitry is configured to generate a control signal for the recovery operation when a program command is input.

13. A memory system comprising:
a memory device comprising plural memory cells and plural switch transistors; and
a controller configured to generate a program command for a program operation on the plural memory cells based on whether to perform a checking or a recovery operation regarding the plural switch transistors, wherein the checking operation checks threshold voltages of the plural switch transistors to determine whether the plural switch transistors are deteriorated and the recovery operation shifts a threshold voltage of a deteriorated switch transistor among the plural switch transistors,
wherein the controller is further configured to perform the checking operation during operation margins based on a programmed data value of plural program operations.

14. The memory system according to claim 13, wherein the program command is one of:
a first program command for performing the program operation along with the checking and recovery operations; and
a second program command for performing the program operation only without the checking and recovery operations.

15. The memory system according to claim 14, wherein the controller is configured to generate the first program command based on program data which is to be programmed as a part of multi-bit data in the plural memory cells of the cell array during the program operation.

16. The memory system according to claim 13, wherein the controller is configured to:
generate an erase command for an erase operation for erasing data remained in the plural memory cells and the checking operation for checking the threshold voltages of the plural switch transistors; and
generate the program command for the program operation and the recovery operation for shifting threshold voltages of the deteriorated switch transistor among the plural switch transistors,

wherein the controller is further configured to perform the checking operation during operation margins based on a programmed data value of plural program operations.

17. The memory system according to claim 13, wherein the plural switch transistors comprise:

at least one drain select transistor configured to control connection between the plural memory cells and a bit line;

at least one source select transistor configured to control connection between the plural memory cells and a common source line; and at least one central switching transistor disposed between the plural memory cells.

18. A memory system comprising:

a memory device comprising plural memory cells and plural switch transistors; and a controller configured to transmit plural data input/output commands to the memory device, the plural data input/output commands designed for the memory device to perform at least one of a checking operation and a recovery operation regarding the plural switch transistors during plural data input/output operations performed based on the plural data input/output commands, wherein the checking operation checks threshold voltages of the plural switch transistors to determine whether the plural switch transistors are deteriorated and the recovery operation shifts a threshold voltage of a deteriorated switch transistor among the plural switch transistors.

19. The memory system according to claim 18, wherein the plural data input/output commands comprise a program command for the memory device to perform a program operation for programming data therein with performing the at least one of the checking operation and the recovery operation.

* * * * *